United States Patent
Kuboi et al.

(10) Patent No.: US 9,431,310 B2
(45) Date of Patent: Aug. 30, 2016

(54) SIMULATION METHOD, SIMULATION PROGRAM, PROCESS CONTROL SYSTEM, SIMULATOR, PROCESS DESIGN METHOD, AND MASK DESIGN METHOD

(71) Applicant: Sony Corporation, Tokyo (JP)

(72) Inventors: Nobuyuki Kuboi, Kanagawa (JP); Takashi Kinoshita, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/522,065

(22) Filed: Oct. 23, 2014

(65) Prior Publication Data

US 2015/0149970 A1  May 28, 2015

(30) Foreign Application Priority Data

Nov. 28, 2013  (JP) ................................ 2013-245647

(51) Int. Cl.
| | |
|---|---|
| *G06F 17/50* | (2006.01) |
| *H01L 21/66* | (2006.01) |
| *H01J 37/32* | (2006.01) |
| *H01L 21/3065* | (2006.01) |

(52) U.S. Cl.
CPC ........... *H01L 22/20* (2013.01); *H01J 37/32926* (2013.01); *H01J 2237/334* (2013.01); *H01L 21/3065* (2013.01); *H01L 22/12* (2013.01)

(58) Field of Classification Search
CPC ............................ H01L 22/12; H01L 21/3065
USPC .......................................................... 716/54
See application file for complete search history.

(56) References Cited

U.S. PATENT DOCUMENTS

| | | | |
|---|---|---|---|
| 8,535,550 B2 * | 9/2013 | Kuboi | ................ G06F 17/5009 216/59 |
| 2011/0082577 A1 * | 4/2011 | Kuboi | ................ G06F 17/5009 700/98 |

FOREIGN PATENT DOCUMENTS

| | | |
|---|---|---|
| JP | 2009-152269 A | 7/2009 |
| JP | 2011-044656 A | 3/2011 |
| JP | 5050830 B2 | 8/2012 |

* cited by examiner

*Primary Examiner* — Vuthe Siek
(74) *Attorney, Agent, or Firm* — Michael Best & Friedrich LLP

(57) ABSTRACT

A simulation method includes acquiring processing conditions for performing an etching process using plasma on a surface of a wafer covered by a mask having a predetermined mask thickness and aperture ratio, calculating, based on the conditions, a flux amount of a reaction product that enters the surface, calculating, based on mask information including the thickness and the aperture ratio and the flux amount, an etching rate of the wafer, calculating, based on the conditions and the etching rate, a dissociation fraction of the product, calculating, based on the information and the etching rate, a solid angle at a predetermined evaluation point set on the surface, the solid angle corresponding to a view area in which plasma space can be seen from the evaluation point, and calculating, based on the etching rate, the dissociation fraction, the solid angle, and the aperture ratio, a control index for evaluating a surface shape.

17 Claims, 21 Drawing Sheets

SIMULATION METHOD, SIMULATION PROGRAM, PROCESS CONTROL SYSTEM, SIMULATOR, PROCESS DESIGN METHOD, AND MASK DESIGN METHOD

CROSS REFERENCE TO RELATED APPLICATIONS

This application claims the benefit of Japanese Priority Patent Application JP 2013-245647 filed Nov. 28, 2013, the entire contents of which are incorporated herein by reference.

BACKGROUND

The present disclosure relates to a simulation method and a simulation program for predicting the process state of a workpiece, and a process control system, a simulator, a process design method, and a mask design method that use the simulation method.

Techniques for simulating the shape of the surface of a wafer, which is changed due to etching or deposition, have been known. For example, in Japanese Patent No. 5050830, in relation to prediction and control of the variability in the process conversion difference in plasma etching of a semiconductor, a simulation method taking into account the effects of a wafer aperture ratio and effective solid angle of a local pattern on the plasma etching is disclosed. By taking into account the effects of these parameters, it is possible to three-dimensionally consider the effect on the shape of a mask pattern in a two-dimensional simulator.

Moreover, in Japanese Patent Application Laid-open No. 2011-044656, a method of simulating the process shape using information obtained by multiplying the flux ($\Gamma$) of a reaction product, which enters a pattern in processing, by the solid angle ($\Omega$) of the pattern, and mask information (aperture ratio and film thickness) as input parameters is described. According to the method, it is possible to optimize the recipe conditions such as a gas flow rate and pressure in real time using $\Gamma*\Omega$ as a control index.

SUMMARY

In recent years, the necessity of producing a device reliably in a plurality of processing apparatuses is increased, and the technique that can control the plurality of processing apparatuses with a common control index is requested.

However, the configuration described in Japanese Patent No. 5050830 and Japanese Patent Application Laid-open No. 2011-044656 performs control using unique information for each processing apparatus, which causes a problem of the control range in which only the apparatus of the unique information is controlled. For example, because an incident flux is based on a monitoring value in a plasma state, it needs a calibration curve for each apparatus to compare the process properties between the apparatuses, which is impractical.

In view of the circumstances as described above, it is desirable to provide a simulation method and a simulation program that can control a plurality of processing apparatuses with a common control index, and a process control system, a simulator, a process design method, and a mask design method that use the simulation method.

According to an embodiment of the present disclosure, there is provided a simulation method including acquiring processing conditions for performing an etching process using plasma on a surface of a wafer covered by a mask having a predetermined mask thickness and aperture ratio. Based on the processing conditions, a flux amount of a reaction product that enters the surface of the wafer is calculated. Based on mask information including the mask thickness and the aperture ratio and the flux amount, an etching rate of the wafer is calculated. Based on the processing conditions and the etching rate, a dissociation fraction of the reaction product is calculated. Based on the mask information and the etching rate, a solid angle at a predetermined evaluation point set on the surface of the wafer, the solid angle corresponding to a view area in which plasma space can be seen from the evaluation point is calculated. Based on the etching rate, the dissociation fraction, the solid angle, and the aperture ratio, a control index for evaluating a shape of the surface of the wafer is calculated.

According to an embodiment of the present disclosure, there is provided a simulation program that causes an information processing apparatus to execute calculation including the steps of calculating, based on processing conditions for performing an etching process using plasma on a surface of a wafer covered by a mask having a predetermined mask thickness and aperture ratio, a flux amount of a reaction product that enters the surface of the wafer, calculating, based on mask information including the mask thickness and the aperture ratio and the flux amount, an etching rate of the wafer, calculating, based on the processing conditions and the etching rate, a dissociation fraction of the reaction product, calculating, based on the mask information and the etching rate, a solid angle at a predetermined evaluation point set on the surface of the wafer, the solid angle corresponding to a view area in which plasma space can be seen from the evaluation point, and calculating, based on the etching rate, the dissociation fraction, the solid angle, and the aperture ratio, a control index for evaluating a shape of the surface of the wafer.

According to an embodiment of the present disclosure, there is provided a process control system including a plurality of etching apparatuses and controllers. The controllers are provided to the plurality of etching apparatuses, each of the plurality of controllers including a communication unit and a controller, the communication unit being capable of communicating with a server, the controller being capable of transmitting processing conditions for performing an etching process using plasma on a surface of a wafer covered by a mask having a predetermined mask thickness and aperture ratio and mask information including the mask thickness and the aperture ratio, and controlling the communication unit to receive, from the server, a control index for evaluating a shape of the surface of the wafer, which is generated using a flux amount of a reaction product that enters the surface of the wafer, which is calculated based on the processing conditions, an etching rate of the wafer, which is calculated based on the mask information and the flux amount, a dissociation fraction of the reaction product, which is calculated based on the processing conditions and the etching rate, a solid angle at a predetermined evaluation point set on the surface of the wafer, the solid angle corresponding to a view area in which plasma space can be seen from the evaluation point, the solid angle being calculated based on the mask information and the etching rate, and the aperture ratio.

According to an embodiment of the present disclosure, there is provided a process control system including a first processing apparatus configured to perform an etching process using plasma on a surface of a wafer, and an information processing apparatus configured to predict shape development of the wafer, which is caused due to the etching process. The information processing apparatus includes an input unit and an arithmetic unit. The input unit is configured to acquire processing conditions for performing the etching process using plasma on a surface of a wafer covered by a mask having a predetermined mask thickness and aperture ratio. The arithmetic unit is configured to calculate, based on the processing conditions, a flux amount of a reaction product that enters the surface of the wafer, to calculate, based on mask information including the mask thickness and the aperture ratio and the flux amount, an etching rate of the wafer, to calculate, based on the processing conditions and the etching rate, a dissociation fraction of the reaction product, to calculate, based on the mask information and the etching rate, a solid angle at a predetermined evaluation point set on the surface of the wafer, the solid angle corresponding to a view area in which plasma space can be seen from the evaluation point, and to calculate, based on the etching rate, the dissociation fraction, the solid angle, and the aperture ratio, a control index for evaluating a shape of the surface of the wafer.

According to an embodiment of the present disclosure, there is provided a simulator including an input unit and an arithmetic unit. The input unit is configured to acquire processing conditions for performing the etching process using plasma on a surface of a wafer covered by a mask having a predetermined mask thickness and aperture ratio. The arithmetic unit is configured to calculate, based on the processing conditions, a flux amount of a reaction product that enters the surface of the wafer, to calculate, based on mask information including the mask thickness and the aperture ratio and the flux amount, an etching rate of the wafer, to calculate, based on the processing conditions and the etching rate, a dissociation fraction of the reaction product, to calculate, based on the mask information and the etching rate, a solid angle at a predetermined evaluation point set on the surface of the wafer, the solid angle corresponding to a view area in which plasma space can be seen from the evaluation point, and to calculate, based on the etching rate, the dissociation fraction, the solid angle, and the aperture ratio, a control index for evaluating a shape of the surface of the wafer.

According to an embodiment of the present disclosure, there is provided a process design method including acquiring processing conditions for performing an etching process using plasma on a surface of a wafer covered by a mask having a predetermined mask thickness and aperture ratio. Based on the processing conditions, a flux amount of a reaction product that enters the surface of the wafer is calculated. Based on mask information including the mask thickness and the aperture ratio and the flux amount, an etching rate of the wafer is calculated. Based on the processing conditions and the etching rate, a dissociation fraction of the reaction product is calculated. Based on the mask information and the etching rate, a solid angle a predetermined evaluation point set on the surface of the wafer, the solid angle corresponding to a view area in which plasma space can be seen from the evaluation point is calculated. Based on the etching rate, the dissociation fraction, the solid angle, and the aperture ratio, a control index for evaluating a shape of the surface of the wafer is calculated. The processing conditions are changed so that the control index is within a predetermined range.

According to an embodiment of the present disclosure, there is provided a mask design method including acquiring processing conditions for performing an etching process using plasma on a surface of a wafer covered by a mask having a predetermined mask thickness and aperture ratio. Based on the processing conditions, a flux amount of a reaction product that enters the surface of the wafer is calculated. Based on mask information including the mask thickness and the aperture ratio and the flux amount, an etching rate of the wafer is calculated. Based on the processing conditions and the etching rate, a dissociation fraction of the reaction product is calculated. Based on the mask information and the etching rate, a solid angle at a predetermined evaluation point set on the surface of the wafer, the solid angle corresponding to a view area in which plasma space can be seen from the evaluation point is calculated. Based on the etching rate, the dissociation fraction, the solid angle, and the aperture ratio, a control index for evaluating a shape of the surface of the wafer is calculated. Design of the mask is changed so that the control index is within a predetermined range.

As described above, according to the present disclosure, it is possible to control a plurality of processing apparatuses with a common control index. It should be noted that the effects described above are not necessarily restrictive, and may be any of those described in the present disclosure.

These and other objects, features and advantages of the present disclosure will become more apparent in light of the following detailed description of best mode embodiments thereof, as illustrated in the accompanying drawings.

DETAILED DESCRIPTION OF EMBODIMENTS

Figure 1:
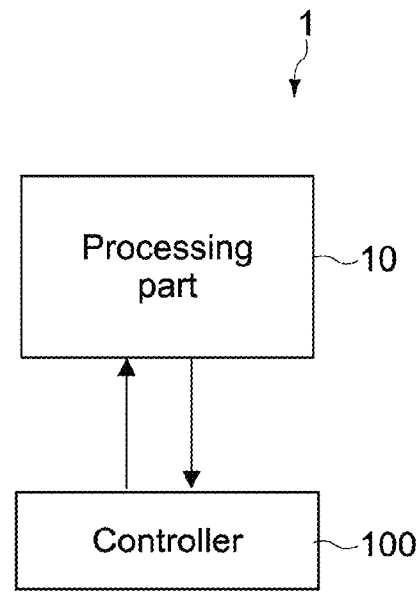
FIG. 1 is a schematic configuration diagram showing a processing apparatus according to a first embodiment of the present disclosure.

Hereinafter, embodiments of the present disclosure will be described with reference to the drawings.
(First Embodiment)
FIG. 1 is a schematic configuration diagram showing a processing apparatus according to a first embodiment of the present disclosure.
(Schematic Configuration of Processing Apparatus)

A processing apparatus 1 includes a processing part 10 and a controller 100. The processing part 10 performs a predetermined processing process on a workpiece. The controller 100 controls the predetermined processing process.

In this embodiment, the processing part 10 is configured of a dry etching device (plasma etching device). Specifically, the processing part 10 is configured of a dray etching device used for producing an electronic device such as a semiconductor device.

The controller 100 is configured to monitor the processing process in the processing part 10 and optimize the process conditions so that the process accuracy is within acceptable spec. In addition, the controller 100 is configured of a simulator that is configured to predict the processing shape of a workpiece based on processing conditions (gas flow rate, pressure, power, wafer temperature, etc.) executed in the processing part 10, and to correct the processing conditions based on the prediction results.

Hereinafter, the details of the processing part 10 and the controller 100 will be described.
(Processing Part)

Figure 2:
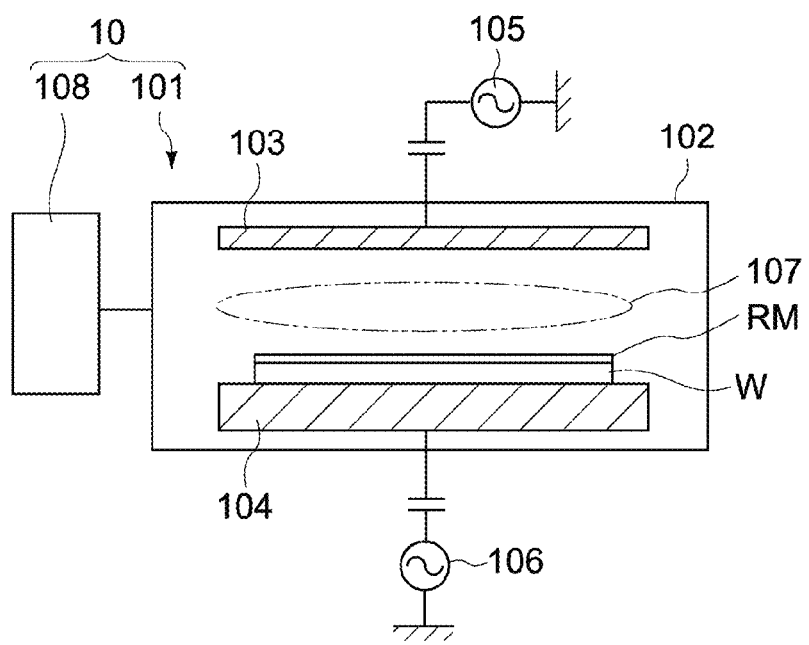
FIG. 2 is a schematic configuration diagram showing a processing part of the processing apparatus.

FIG. 2 is a schematic configuration diagram showing the processing part 10. The processing part 10 includes an etching device 101 and a monitoring device 108. Here, the etching device 101 is described as a capacitively coupled plasma (CCP) etching device. However, other than the CCP etching device, an inductively coupled plasma (ICP) etching device, an electron cyclotron resonance (ECR) etching device, or the like, can be applied to the etching device 101.

The etching device 101 includes a chamber 102, an upper electrode 103, and a lower electrode 104. The upper electrode 103 and the lower electrode 104 are arranged in the chamber 102 to face each other. The lower electrode 104 has also a function as a stage that supports a wafer (workpiece) W, and includes a temperature adjusting unit that can adjust the wafer temperature. To the upper electrode 103 and the lower electrode 104, high radio-frequency power supplies 105 and 106 are connected, respectively.

The etching device 101 is configured so that the chamber 102 is evacuated to a predetermined reduced pressure atmosphere via a vacuum pump (not shown) and a predetermined process gas (etching gas, inert gas, or the like) can be conducted to the chamber 102 via a gas conducting line (not shown). The etching apparatus 101 applies electric power from the high radio-frequency power supplies 105 and 106 to the upper electrode 103 and the lower electrode 104, thereby forming a plasma 107 between the upper electrode 103 and the lower electrode 104 to etch the surface of the wafer W.

On the surface of the wafer W, a mask for processing RM (e.g., a resist mask) is provided. The mask RM has an opening pattern in a predetermined shape, which defines the etching area. The surface area of the wafer W, which is exposed from the opening pattern, is etched, thereby forming the etching pattern on the surface of the wafer W.

The monitoring device 108 is connected to the etching device 101 and includes a plurality of detectors that detect various types of physical amounts from the plasma 107. Specifically, the monitoring device 108 includes various types of measurement devices that can measure the plasma state or device state, such as an optical emission spectrometer (OES), an equipment engineering system (EES), a quadrupole mass spectrometer (QMS), and an infrared-diode laser absorption spectroscopy (IRLAS).
(Controller)

Figure 3:
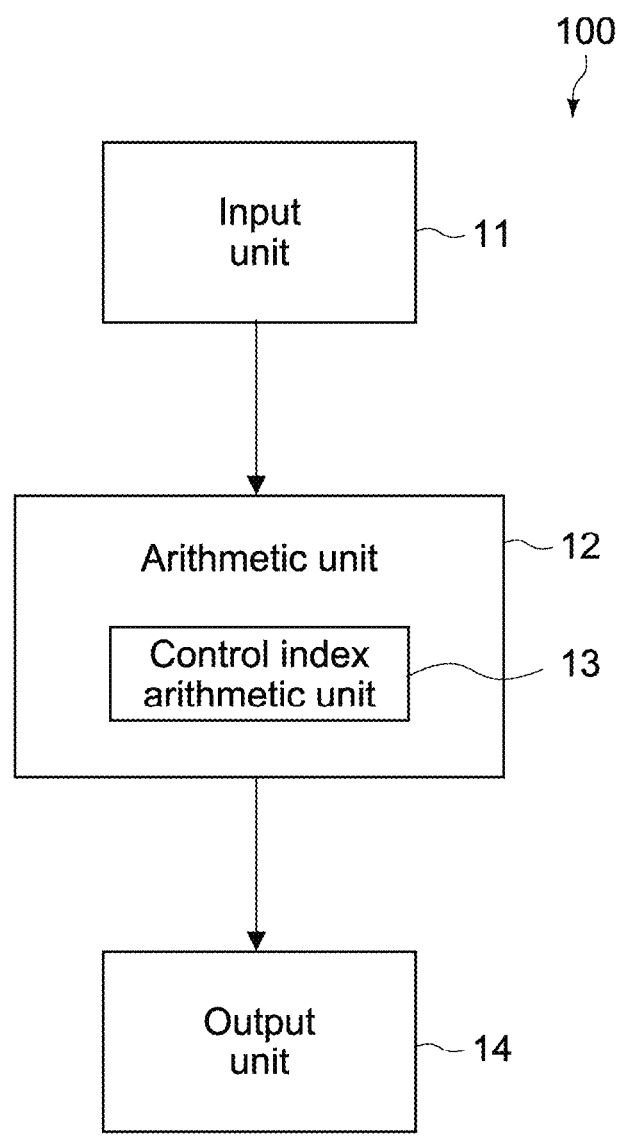
FIG. 3 is a schematic configuration diagram showing a controller in the processing apparatus.

FIG. 3 is a schematic configuration diagram showing the controller 100. The controller 100 is typically configured of a computer (information processing apparatus). Moreover, in this embodiment, the controller 100 is configured of a simulator.

The controller 100 includes an input unit 11, an arithmetic unit 12, and an output unit 14. The input unit 11 is configured to acquire processing conditions for performing a predetermined processing process on a workpiece and detection data obtained from the monitoring device 108, and to input them to the arithmetic unit 12. The input unit 12 includes a control index arithmetic unit 13. The control index arithmetic unit 13 calculates a control index for evaluating the shape development, damage, or the like of a workpiece by a simulation method to be described later based on the processing conditions input via the input unit 11.

The arithmetic unit 12 may be configured of hardware to achieve the calculation process to be described later, and may perform the calculation process using a predetermined simulation program (software). In this case, the control index arithmetic unit 13 is configured of an arithmetic device such as a central processing unit (CPU), loads a simulation program from the outside, and executes the program, thereby performing the calculation.

The simulation program can be stored in, for example, a database (not shown) or a storage unit such as a read only memory (ROM) separately provided. At this time, the simulation program may be mounted in advance on a database, a storage unit separately provided, or the like, or may be mounted from the outside on a database, a storage unit separately provided, or the like. In the case where the simulation program is acquired from the outside, the simulation program may be distributed from a medium such as an optical disc and a semiconductor memory, or may be downloaded through a transmission means such as the Internet.

The output unit 14 is configured to output the simulation results of a predetermined processing process calculated by the arithmetic unit 12. The output unit 14 may output information such as processing process conditions and parameters used for the calculation together with the simulation results of the processing process. The output unit 14 is configured of a device such as a display device that displays simulation results, for example, a printing device that prints and outputs simulation results, and a recording device that records simulation results, or appropriate combination of these devices. In this embodiment, an example in which the controller 100 includes the output unit 14 is described. However, the present disclosure is not limited thereto, and the output unit 14 may be provided on the outside of the controller 100.

The controller 100 may further include a database unit that stores various parameters necessary for the calculation process performed in the arithmetic unit 12. Moreover, such a database unit may be provided on the outside of the controller 100. In the case where various parameters necessary for the calculation process are input from the outside at needed, the database unit does not have to be provided.

The controller 100 controls the etching conditions on the processing part 10 so that the etching pattern formed on the surface of the wafer W being a workpiece has a predetermined shape. Typically, the controller 100 controls the etching conditions so that the process conversion difference (ΔCD) of the etching pattern formed on the surface of the wafer W is uniform.

Figure 4:
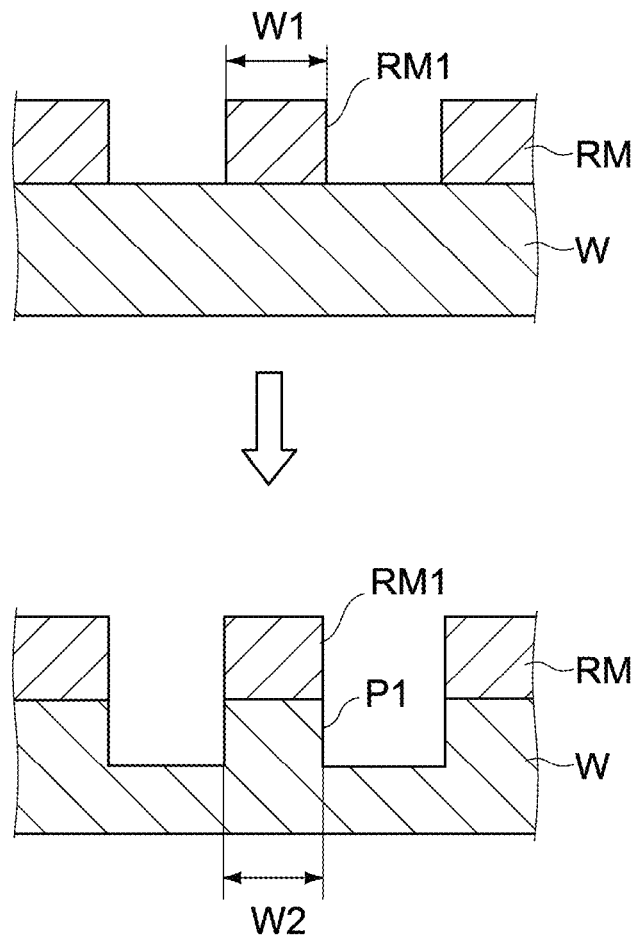
FIG. 4 is a cross-sectional view of a pattern for explaining a process conversion difference.

As shown in FIG. 4, the process conversion difference is a difference between a pattern width W1 of a mask pattern RM1 before the wafer W is etched and a width W2 of an etching pattern P1 of a wafer W, which is formed by the etching using the mask pattern RM1 as a mask.

Here, a processing method in which an etching process is progressed while generating a reaction product that protect a substrate W from etching depending on the etching conditions has been known. With the method, the etching pattern P1 can be protected from side etching and an etching pattern having a high aspect ratio can be formed by etching the substrate W while depositing the reaction product on side walls of the etching pattern P1. On the other hand, if the reaction product is thickly deposited on the side walls of the etching pattern P1, the side walls of the etching pattern P1 have a tapered shape, which increases the process conversion difference excessively.

In view of the above, the controller 100 controls the amount of deposition of the reaction product on the etching pattern P1 by correcting the etching conditions to maintain the process conversion difference (ΔCD) within a certain range.

Figure 5:
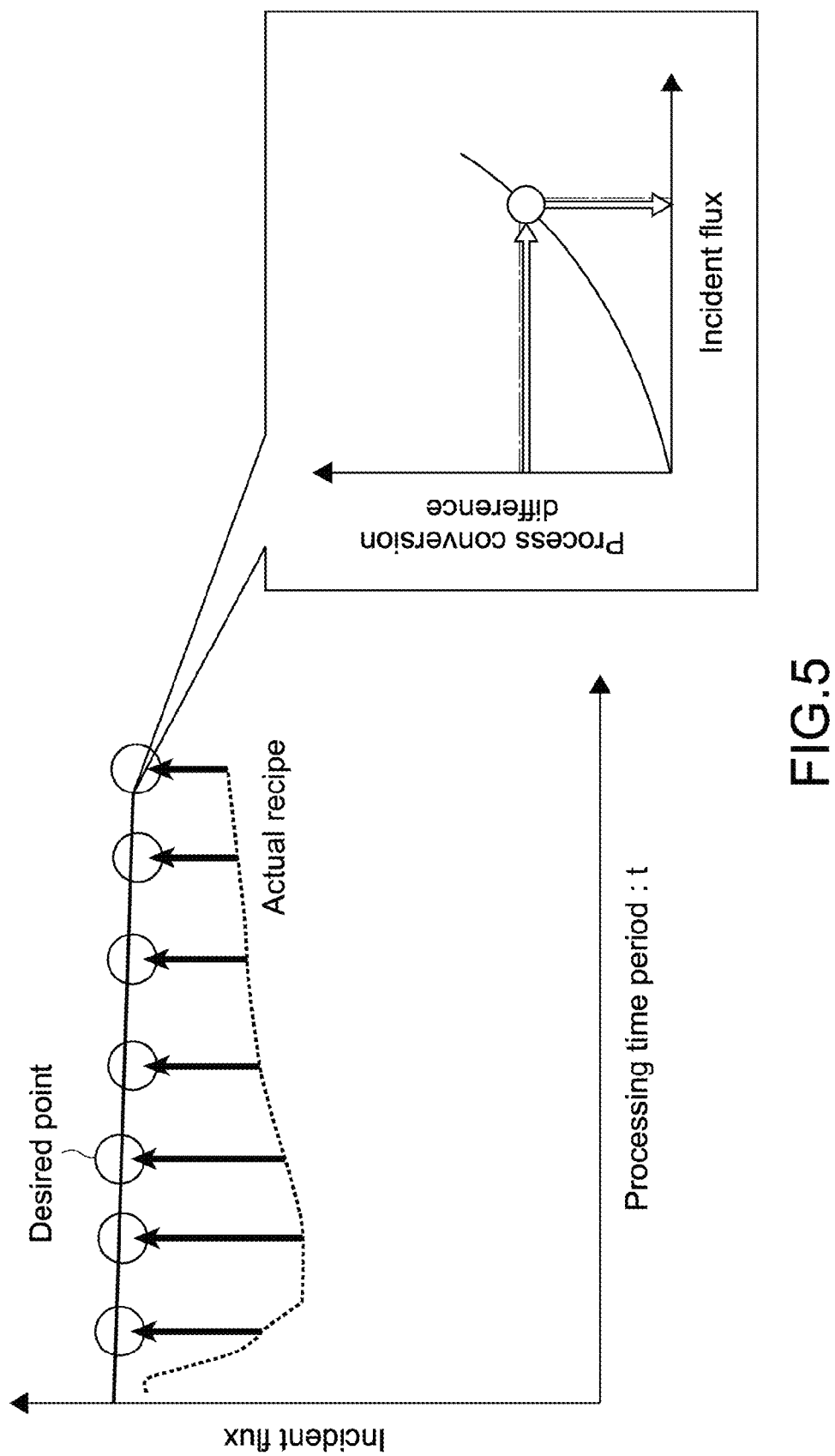
FIG. 5 is a diagram for explaining an example of controlling etching conditions with the controller.

FIG. 5 is a diagram for explaining a typical example of controlling etching conditions with the controller. In this example, an example of controlling the etching conditions for maintaining the process conversion difference to be uniform is described.

As described above, as the amount of incident flux of the reaction product on the etching pattern, which functions as an etching protection film, increases, the process conversion difference increases. On the other hand, if the actual recipe being actual etching conditions is fixed, the amount of incident flux also changes randomly depending on the processing time period with the variation of the plasma state. In this regard, the controller 100 maintains the process conversion difference within a certain range by correcting the actual recipe to a desired point at an appropriate time interval so that the amount of incident flux is uniform without depending on the processing time period.

In order to achieve the control, the controller 100 executes the shape development simulation for evaluating the process conversion difference of an etching pattern. In this embodiment, the relational expression between the amount of various particles that enter the workpiece from the surrounding gas (outside) and the amount of various particles emitted from the workpiece on the surface of a workpiece (processed surface) is calculated with a flux method. At this time, a reaction model between the workpiece and gas is set.

(Reaction Model of Workpiece)

Hereinafter, an example of a reaction model when a polysilicon film (poly-Si) formed on a wafer is dry-etched by gas containing halogen (HBr)-based gas and oxygen (O) will be described.

Figure 6:
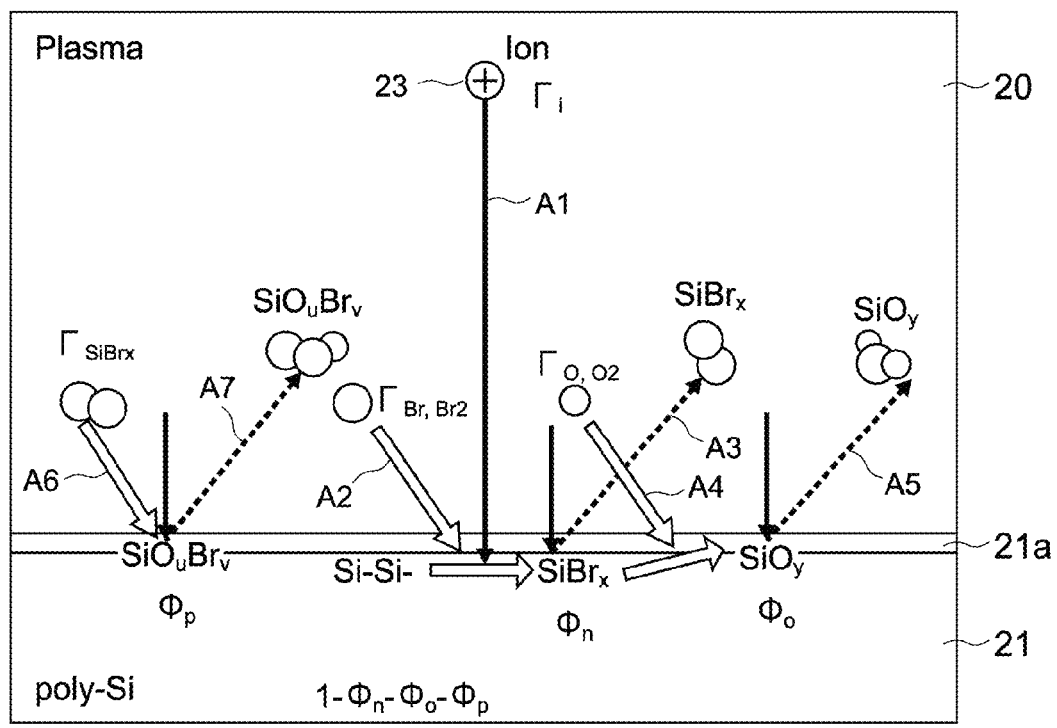
FIG. 6 is a diagram showing the overview of a reaction model in the vicinity of the interface between a polysilicon film and gas (plasma) around it.

FIG. 6 is a diagram showing the overview of a reaction model in the vicinity of the interface between a polysilicon film and gas (plasma) around it. If a polysilicon film 21 is dry-etched in an atmosphere of a plasma 20 of HBr-based gas, an etching reaction layer 21a (hereinafter, referred to as simply "reaction layer 21a") is formed in the vicinity of the surface of the polysilicon film 21.

If a particle 23 enters the polysilicon film 21 from the plasma 20 (gas) (shown by an arrow A1), bonding between silicon atoms (Si—Si) is broken in the reaction layer 21a. One silicon atom whose bonding is broken in the reaction layer 21a reacts (bonds) with bromine (Br and $Br_2$) in the HBr-based gas (shown by an arrow A2), which enters from the plasma 20, to form $SiBr_x$ (x represents a positive number). Then, the generated $SiBr_x$ is emitted from the polysilicon film 21 to the outside (shown by an arrow A3). The reaction area ratio at this time is represented by $\phi n$ ($0 \leq \phi n \leq 1$).

On the other hand, another silicon atom whose bonding is broken in the reaction layer 21a reacts with oxygen (shown by an arrow A4) that enters from the plasma to form $SiO_y$ (y represents a positive number). Then, the generated $SiO_y$ is emitted from the polysilicon film 21 to the outside (shown by an arrow A5). The reaction area ratio at this time is represented by $\phi o$ ($0 \leq \phi o \geq 1$).

Furthermore, the $SiBr_x$ emitted from the polysilicon film 21 enters the polysilicon film 21 again (shown by an arrow A6), and reacts with oxygen (O and $O_2$) existed on the surface of the polysilicon film 21. $SiOuBr_v$ (u and v represent positive numbers) being the resultant reaction product is deposited on the polysilicon film 21. Then, $SiOuBr_v$ formed from the deposition product on which the particle 23 is incident from the plasma 20 is emitted from the polysilicon film 21 to the outside (shown by an arrow A7). The reaction area ratio at this time is represented by $\phi p$ ($0 \leq \phi p \leq 1$).

As described above, the ratio of the area in which the above-mentioned reactions are not caused in the polysilicon film 21 is represented by $1-\phi n-\phi o-\phi p$. Here, the particle 23 and bromine (radical) that enter the polysilicon film 21 from the plasma 20 etch mainly the polysilicon film 21, and $SiBr_x$ (or $SiOuBr_v$) being a reaction product of bromine and silicon forms a protection film that protects the polysilicon film 21 from etching.

In this embodiment, the relationship between the amount of incident particles in the reactions and the amount of emitted (product) particles (hereinafter, collectively referred to as the flux amount of reaction particles) is solved by a flux method, and the shape development or damage of the etching pattern on a wafer is predicted and evaluated.

(Reference Technique)

Figure 7:
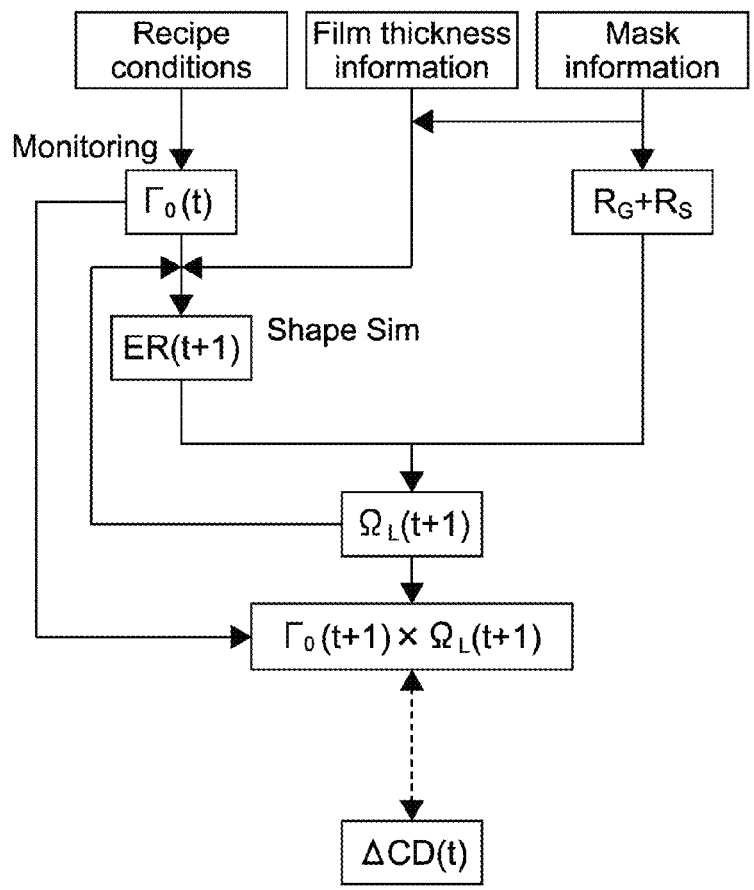
FIG. 7 is a flowchart showing the calculation procedure in a simulation method according to a reference technique.

FIG. 7 is a flowchart showing the calculation procedure in a simulation method according to a reference technique. Hereinafter, a description will be made schematically.

In the simulation method according to the reference technique, the incident flux amount ($\Gamma$) of a reaction product on the etching pattern, which functions as an etching protection film, an etching rate (ER), the aperture ratio ($R_G$ and $R_S$) of the mask RM, and the solid angle ($\Omega_L$) at an incident point of the reaction product flux are used as indexes.

Here, the "recipe conditions," the "film thickness information," and the "mask information" correspond to the etching conditions on the processing part 10 (processing conditions), the processed film (polysilicon film 21 in the example of FIG. 5), and information on the thickness and aperture ratio of the mask RM, respectively. Moreover, $R_G$ represents the wafer aperture ratio and $R_S$ represents the semi-local aperture ratio (aperture ratio in a chip) (details of $R_G$ and $R_S$ will be described later).

In the simulation method according to the reference technique, the etching rate (ER) is calculated from the incident flux amount ($\Gamma_0$). Moreover, based on the calculated etching rate (ER) and the aperture ratio ($R_G$ and $R_S$) of the mask RM obtained from the mask information, the solid angle ($\Omega_L$) at an incident point of a flux is calculated. Then, the product of the incident flux amount ($\Gamma_0$) and the calculated solid angle ($\Omega_L$) is used as a control index to evaluate the process conversion difference ($\Delta$CD). It should be noted that signs (t) and (t+1) assigned to $\Gamma_0$, ER, $\Omega_L$, and $\Delta$CD represent steps of calculation time.

In recent years, the necessity of producing a device reliably in a plurality of processing apparatuses is increased, and the technique that can control the plurality of processing apparatuses with a common control index is requested. However, the simulation method according to the reference technique performs control using unique information for each processing apparatus, which causes a problem of the control range in which only the apparatus of the unique information is controlled.

Figure 8:
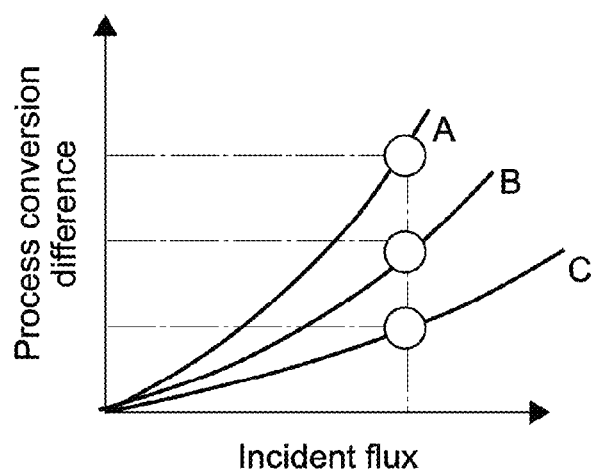
FIG. 8 is a diagram for explaining problems in the reference technique.

For example, because the incident flux amount ($\Gamma_0$) of the reaction product is acquired based on a monitoring value in a plasma state, the measured value changes for each processing apparatus. Therefore, as schematically shown in FIG. 8, because the incident flux amounts that can achieve a predetermined process conversion difference are different in processing apparatuses A, B, and C, it may be impossible to control the plurality of processing apparatuses with a common control index.

On the other hand, the miniaturization and diversification of devices have proceeded in recent years, and therefore, the technique that can reduce not only the process conversion difference but also the damage (e.g., crystal defect) on a wafer caused during processing is requested. However, the simulation method according to the reference technique makes matching of the process conversion difference a top priority, which causes a problem of low control flexibility.

In view of the above, in this embodiment, the controller 100 is configured to achieve a predetermined process conversion difference by executing a simulation method using a control index that is not derived from a processing apparatus. In addition, the controller 100 is configured to be capable of controlling not only the process conversion difference but also the damage caused during processing with the simulation method.

(Simulation Method)

Hereinafter, the simulation method according to this embodiment will be described.

(Control Method)

Figure 9:
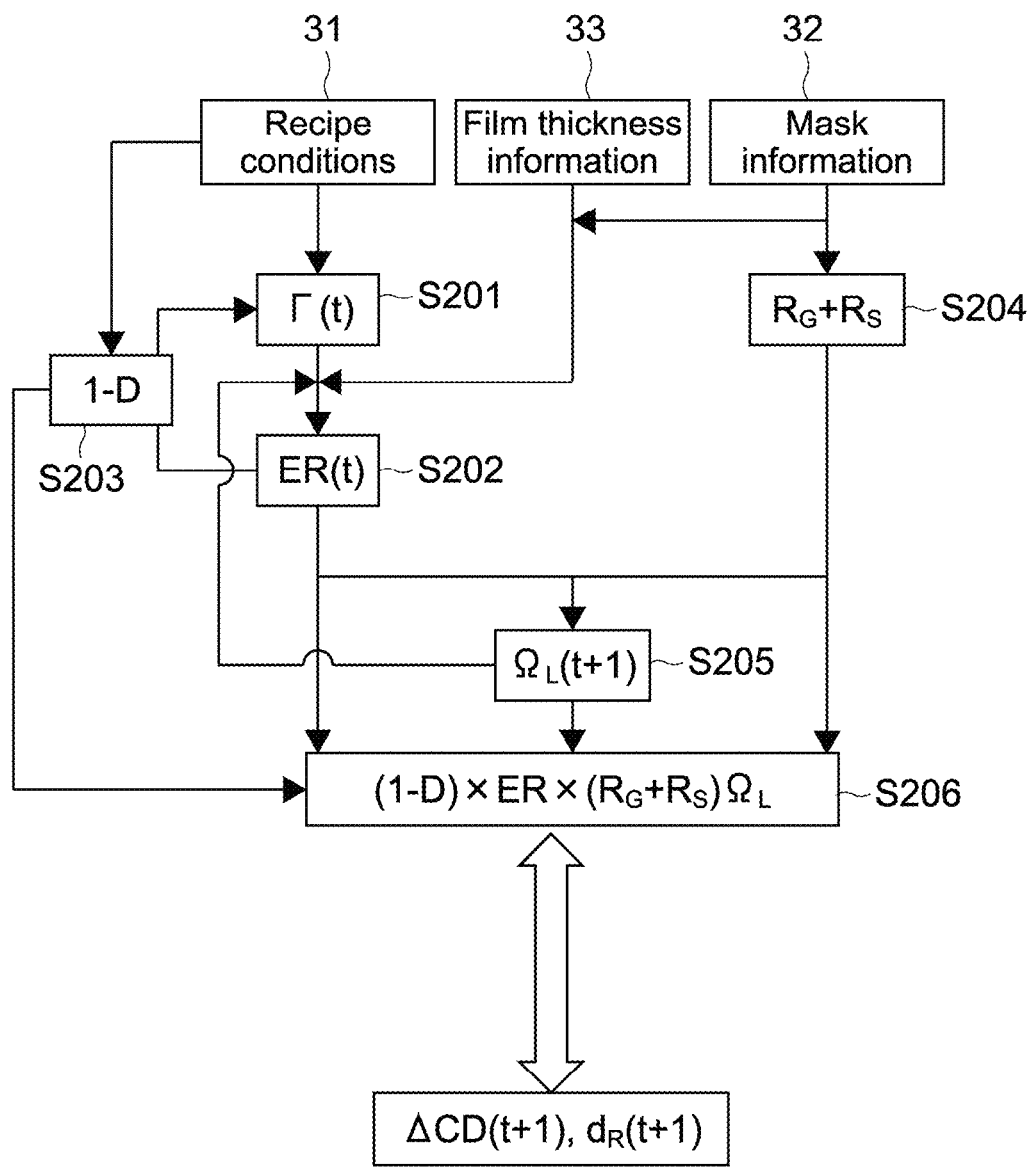
FIG. 9 is a flowchart showing the calculation procedure in a simulation method according to an embodiment of the present disclosure.

FIG. 9 is a flowchart showing the calculation procedure for executing the simulation method according to this embodiment.

In this embodiment, an index including at least the incident flux amount ($\Gamma$), the etching rate (ER), the dissociation fraction (D), the solid angle ($\Omega_L$), and the mask aperture ratio ($R_G$ and $R_S$), i.e., $(1-D)*ER*(R_G+R_S)\Omega_L$, is used as a control index. Accordingly, as will be described later in detail, the process conversion difference ($\Delta$CD) and the damage ($d_R$) of the wafer W during processing (which represents damage depth or damage thickness) can be used in the same index to perform control.

Here, $\Gamma$, ER, D, $\Omega_L$, $R_G$, and $R_S$ represent the incident flux amount of a reaction product on an etching pattern, which functions as an etching protection film, the etching rate, the dissociation fraction of the reaction product, the three-dimensional viewing angle obtained by viewing a pattern opening from the surface of a workpiece, the wafer aperture ratio, and the semi-local aperture ratio, respectively. Details thereof will be described later. It should be noted that signs (t) and (t+1) assigned to $\Gamma$, ER, $\Omega_L$, $\Delta$CD, and $d_R$ represent steps of calculation time.

Figure 10:
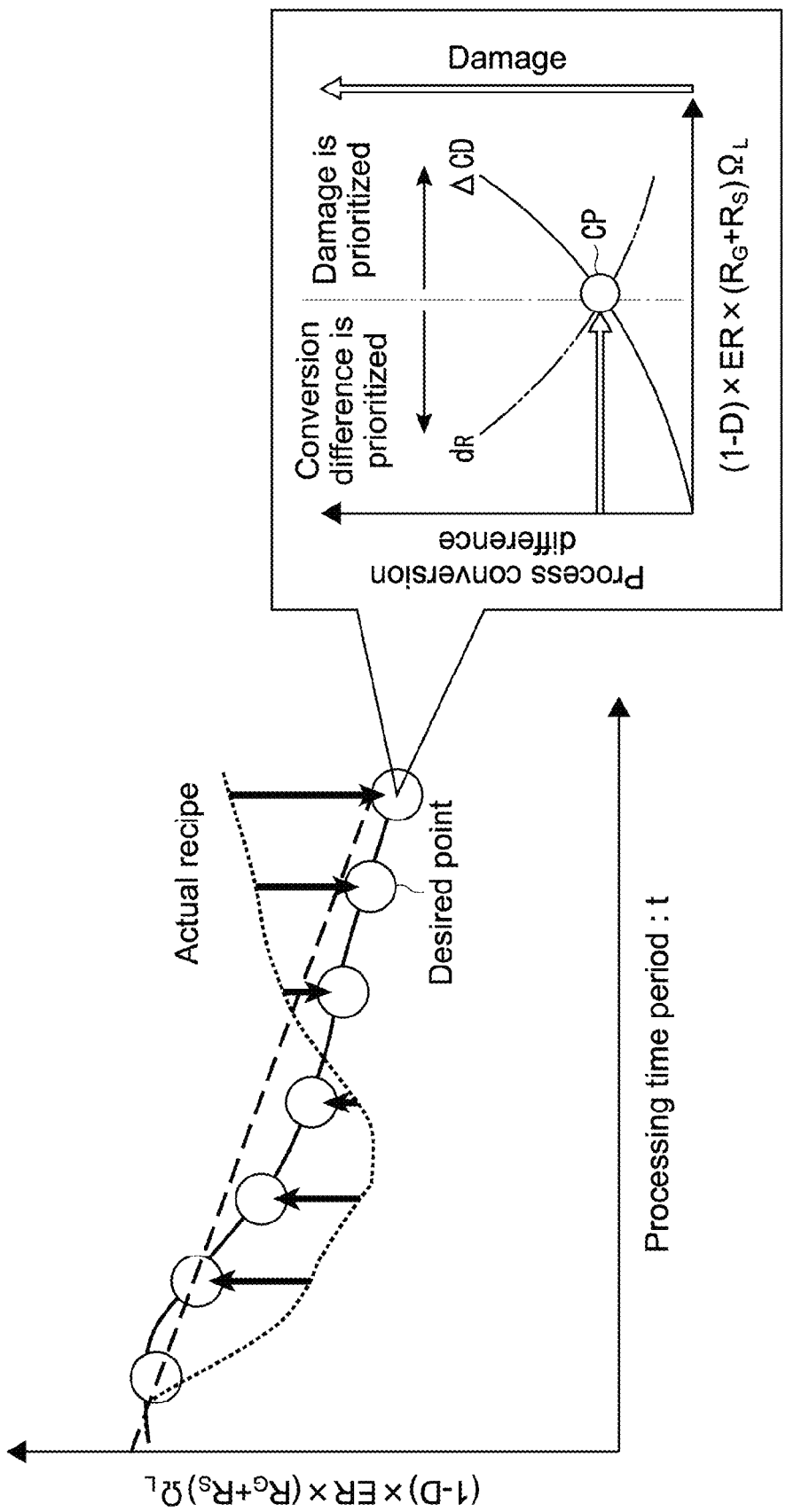
FIG. 10 is a diagram for explaining an example of controlling etching conditions that can be achieved by the simulation method.

FIG. 10 is a diagram for explaining a method of controlling the processing part 10 by the controller 100.

According to this embodiment, as the control index $((1-D)*ER*(R_G+R_S)\Omega_L)$ increases, the process conversion difference ($\Delta$CD) increases as shown in right part of FIG. 10 and the damage ($d_R$) decreases. Therefore, in the case where the process conversion difference ($\Delta$CD) and the damage ($d_R$) are prioritized, an intersection point CP of curves is used as a control index that optimizes the process conversion difference ($\Delta$CD) and the damage ($d_R$).

In this case, as shown in right part of FIG. 10, the actual recipe conditions (etching conditions) are automatically corrected so that the control index that changes with time traces the reference index (desired point). Examples of the actual recipe conditions to be corrected include process conditions that change the dissociation fraction (D) and the etching rate (ER) such as gas pressure, gas flow rate, bias (high-frequency power applied to the upper electrode 103 or the lower electrode 104), and wafer temperature.

On the other hand, in the case where the process conversion difference ($\Delta$CD) is emphasized, it only needs to set the control index to be small. On the contrary, in the case where low damage is emphasized, it needs to set the control index to be large. The correction of the process conditions can be performed at a certain time step, e.g., second order. Moreover, control such that the process conversion difference ($\Delta$CD) is prioritized in the early part of the processing process, and the damage ($d_R$) is prioritized in the latter part of the processing process may be performed, for example.

(Derivation of Control Index)

Figure 11:
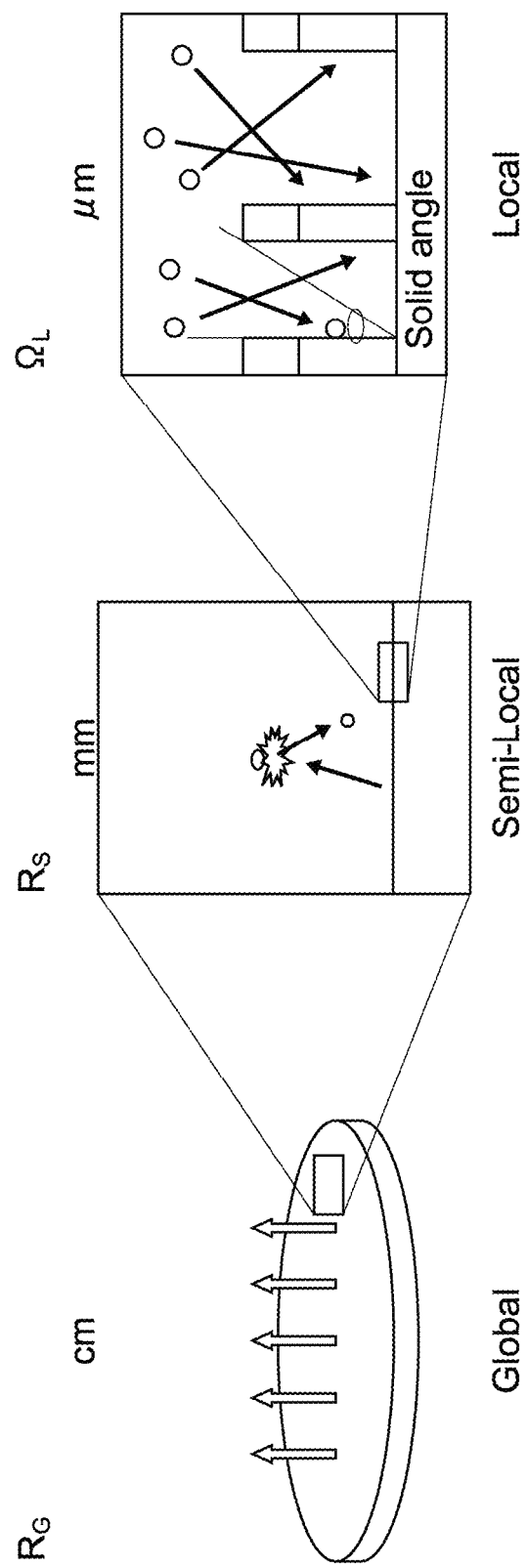
FIG. 11 is a model diagram showing a flux of a reaction product, which enters the pattern of the surface of a wafer.
Figure 12:
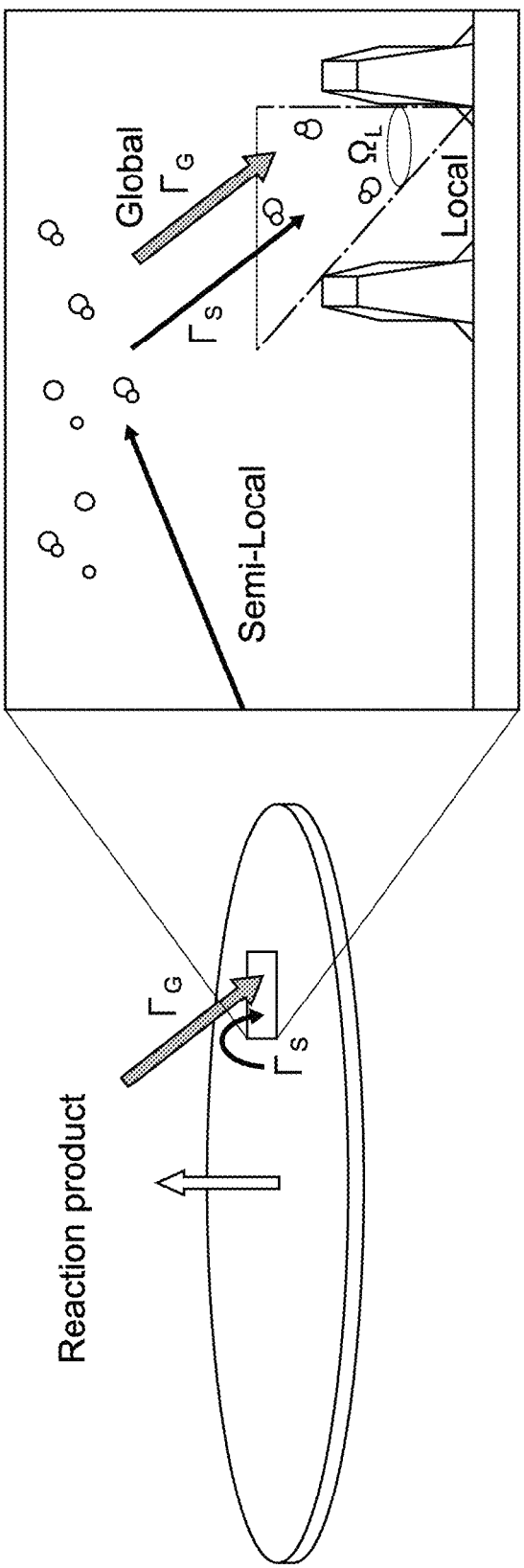
FIG. 12 is a model diagram showing a flux of a reaction product, which enters the pattern of the surface of a wafer.

In this embodiment, as described above, $(1-D)*ER*(R_G+R_S)\Omega_L$ is used as a control index of the process conversion difference ($\Delta$CD) and the damage ($d_R$). However, the derivation will be described with an example of an Si gate process using HBr/O$_2$ gas. FIG. 11 and FIG. 12 are each a model diagram showing a flux of a reaction product that enters the pattern of the surface of a wafer.

First, as a model of a flux of a reaction product that affects the process conversion difference, three elements of the wafer aperture ratio (Global), semi-local aperture ratio (Semi-Local), and the solid angle (Local) are considered. The levels of the three elements are a wafer level (cm order), a chip level (mm order), and a pattern level (μm). At this time, in the case where it is agitated by plasma during processing and a part of it enters a pattern again without disassociating, the incident flux of a reaction product (here, e.g., SiBr) on the processing surface can be expressed by the following formulae (1) and (2).

$$\Gamma_G = R_G \times ER \times \rho_{Si} \times (1-D_G) \times (\Omega_L/2) \tag{1}$$

$$\Gamma_S = R_S \times ER \times \rho_{Si} \times (1-D_S) \times (\Omega_L/2) \tag{2}$$

Here, $\Gamma_G$ and $\Gamma_S$ represent the incident flux amounts to which the wafer aperture ratio and the semi-local aperture ratio contributes, respectively. $\rho_{Si}$ represents the number density of Si. $D_G$ and $D_S$ represent the dissociation fractions of the reaction product in plasma, which is attributed to the wafer aperture ratio and the semi-local aperture ratio, respectively. If $D_G$ and $D_S$ are approximated by the following formula: DG~DS=D, the total flux amount $\Gamma_{SiBr}$ of a reaction product that enters the processing surface can be represented by the following formula (3).

$$\Gamma_{SiBr} = (\Gamma_G + \Gamma_S) \propto (1-D) \times ER \times (R_G + R_S) \Omega_L \quad (3)$$

Figure 13:
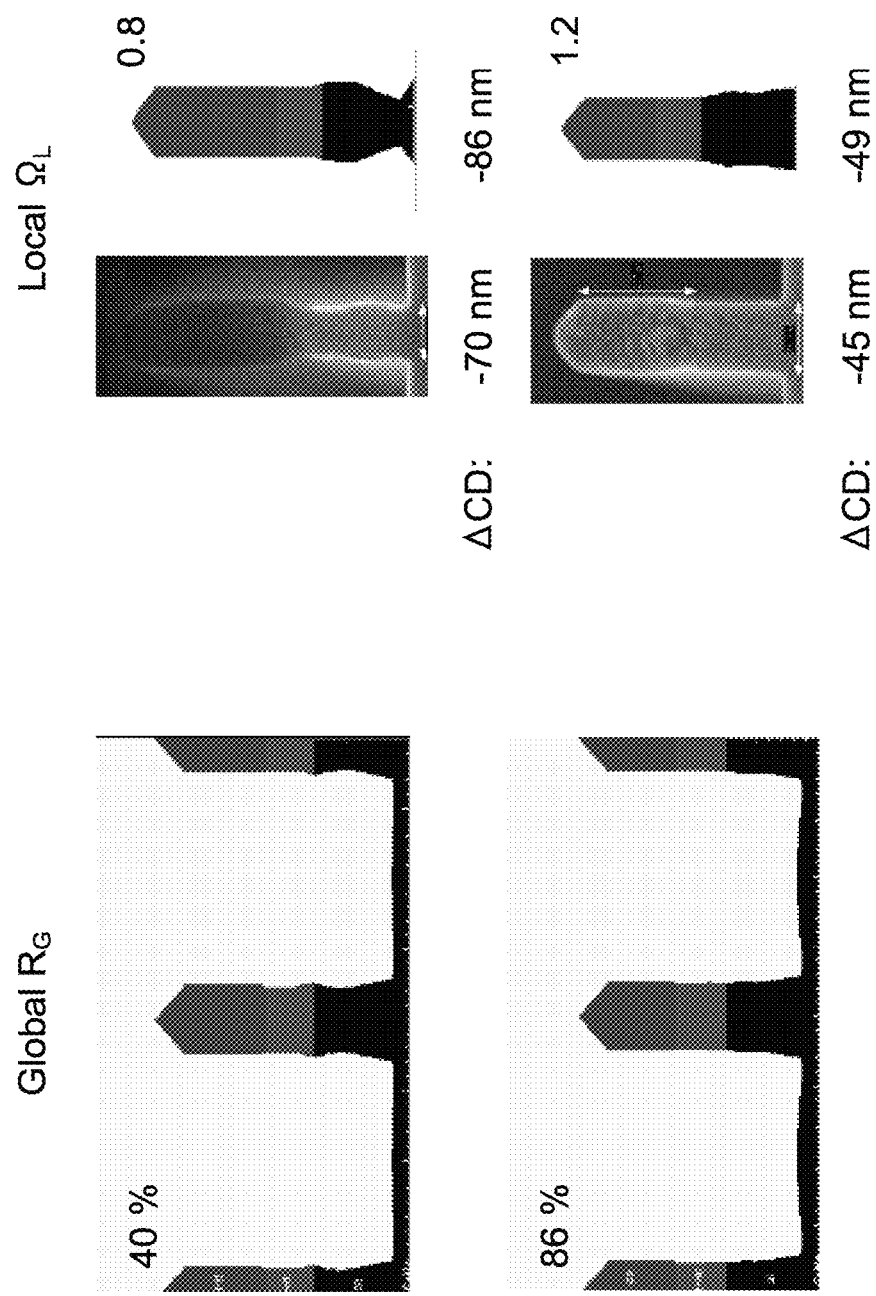
FIG. 13 is a diagram showing the calculation results obtained by the simulation method and the pattern shape processed actually with comparison to each other.

The results of the shape simulation executed by applying the flux derived in this way to the Si surface reaction model of the ion assist as shown in FIG. 6 are shown in FIG. 13. The upper left part of FIG. 13 shows the simulation results of the surrounding of the target pattern (pattern being a simulation target) at the time when the wafer aperture ratio is 40%, and the lower left part of FIG. 13 shows the simulation results of the target pattern at the time when the wafer aperture ratio is 86%. Moreover, the upper right part of FIG. 13 shows the cross-sectional SEM photograph (left part) of the target pattern having a solid angle of 0.8 and the shape simulation results (right part) with comparison to each other, and the lower right part of FIG. 13 shows the cross-sectional SEM photograph (left part) of the target pattern having a solid angle of 1.2 and the shape simulation results (right part) with comparison to each other.

As shown in FIG. 13, when the wafer aperture ratio $R_G$ increases, the amount of reactions products that enter again also increases. Accordingly, the taper angle of the processing shape increases and also the process conversion difference increases. Moreover, the same holds true for the case where the solid angle increases, and it is confirmed that the shape of side etching changes to a tapered shape. These reproduce the features of the actually measured shape and the variability in the process conversion difference value well. Therefore, the above-mentioned flux model is reasonable, and $(1-D)*ER*(R_G+R_S)\Omega_L$ can be used as a control index of the process conversion difference.

Figure 14:
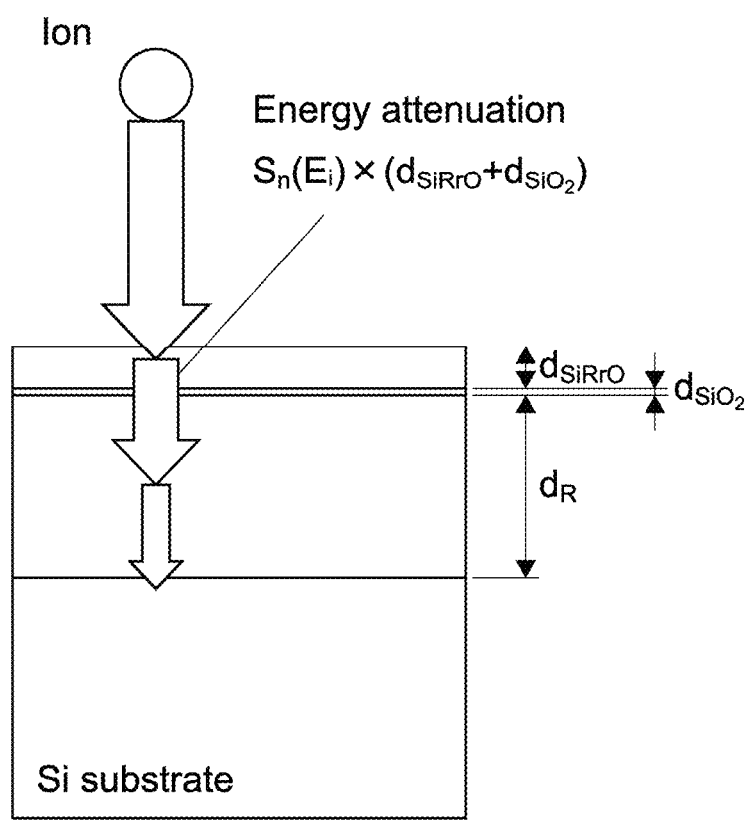
FIG. 14 is a schematic diagram for explaining damage on a wafer during processing.

On the other hand, as shown in FIG. 14, in relation to the damage, the Si substrate damage is considered to be formed by the ion (energy: Ei, flux: $\Gamma$i) that enters the Si gate pattern. In this case, the ion loses energy when it passes through a reaction product deposited on the processing surface, which has a thickness of $d_{SiBrO}$ and the SiO$_2$ film being a base having a thickness of $d_{SiO2}$, and the remaining energy gives the damage on the Si substrate. The relationship between the damage obtained from the actual measurement (damage depth) and the incident ion energy (e.g., Eriguchi et al, Jpn. J. Appl. Phys. 49, 08JC02 (2010)) and the flux formula derived as described above can be used to represent the damage ($d_R$) as the following formula (4).

$$d_R(t) \propto \sqrt{E_i - S_n(E_i)[d_{SiBrO}(t) + d_{SiO2}]} \sim \alpha$$
$$\sqrt{\beta - \gamma \times (R_G+R_S)\Omega_L + \delta} \sim$$
$$\sqrt{\beta - \gamma'(1-D) \times ER \times (R_G+R_S)\Omega_L + \delta} \quad (4)$$

Here, $\beta$, $\gamma$, and $\delta$ can be expressed by the following formulae.

$$d_{SiBrO}(t) = \Gamma_{SiBr}/\rho_P \quad (5)$$

$$\beta = E_i - S_n(E_i)\left(\int_0^{t1} DR_P(t)dt + d_{SiO2}\right) \quad (6)$$

$$\gamma = \frac{1}{2}S_n(E_i)S_{SiBr}(1-D)\frac{\rho_{Si}}{\rho_P}\int_{t1}^{t1+\Delta t} ER(t)dt \quad (7)$$

$$\delta = \frac{S_n(E_i)}{\rho_P}\int_0^{t1+\Delta t} \Gamma_i \Phi_P dt \quad (8)$$

Here, $\rho_P$, Sn, DRP, $S_{SiBr}$, $\Phi_P$, t1, and $\Delta t$ represent the density of the deposited reaction product, the stopping power, the deposition rate of the reaction product, the attachment probability, the surface covering ratio of the reaction product, the period of time when the ion does not reach the base Si, and the period of time when the ion reaches the base Si, respectively.

Figure 15:
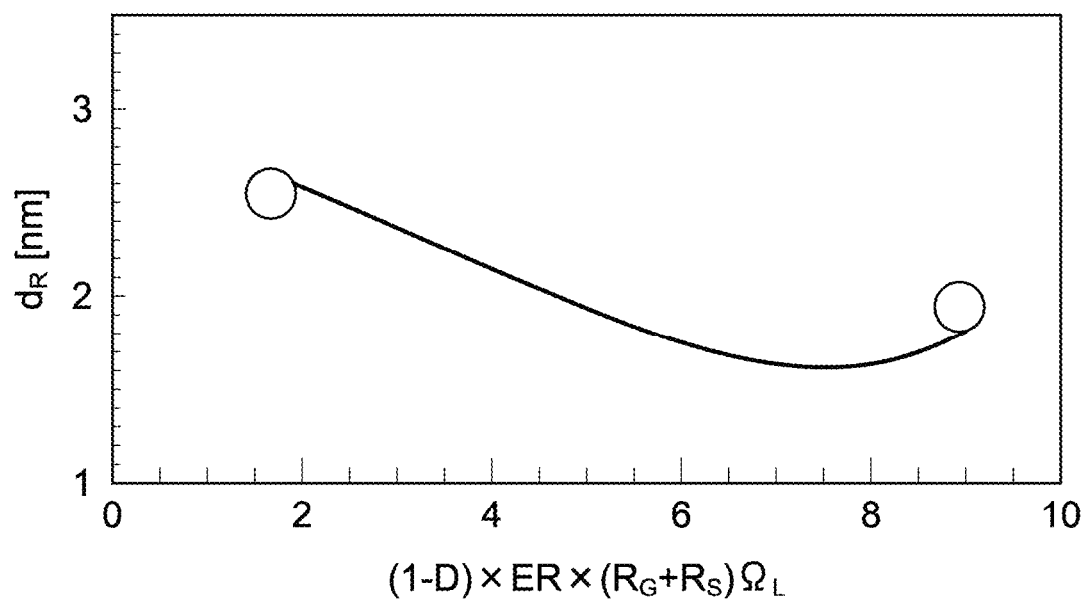
FIG. 15 is a diagram showing the results obtained by calculating the control index dependence of the damage (top view) and the TEM image of the actual damage (bottom view)
Figure 15:
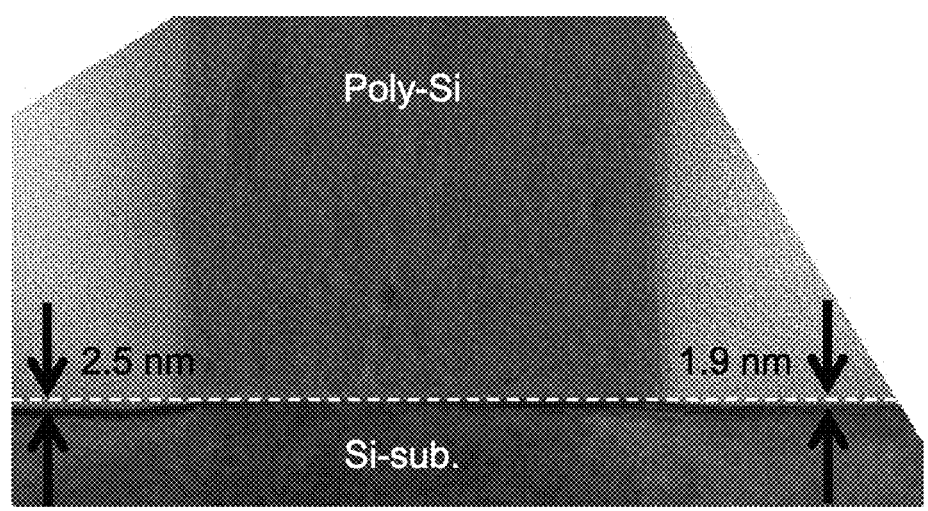

The results obtained by calculating the control index $((1-D)*ER*(R_G+R_S)\Omega_L)$ dependence of the damage ($d_R$) (top view) and the TEM image of the actual damage (bottom view) are shown in FIG. 15. The process conditions used for calculation are the same as those of the actual processing conditions. The right and left parts of the Si gate have states where an adjacent pattern is dense (Narrow) and is not dense (Wide). However, the actual damage thickness and the calculation results show good consistency.

Therefore, the control index $((1-D)*ER*(R_G+R_S)\Omega_L)$ can be used for also the damage similarly. It should be noted that as shown in the top view of FIG. 15, the damage ($d_R$) decreases in the actual pattern range with respect to the control index $((1-D)*ER*(R_G+R_S)\Omega_L)$.

The example of the Si gate process by HBr/O$_2$ gas has been described. However, because the formulae (1) to (8) do not depend on gas or material, the formulae (1) to (8) are not limited thereto, and the reasonability of the control index is established with respect to another gas or pattern.

(Control System)

The control system that can be achieved in the present disclosure can adopt the control method using the control index, thereby establishing the following two main systems.

One of the two systems is a centralized control system using cloud computing, and is configured of a cloud simulation system, a group of processing apparatuses, a group of plasma monitoring apparatuses, a group of networks, and the like. The control system has features of being capable of intensively managing high accuracy-simulation that is necessary for calculating the control index collectively by cloud computing.

The other of the two systems is a distributed control system using mutual exchanges, and is configured of a simple prediction system, a group of processing apparatuses, a group of plasma monitoring apparatuses, a group of networks, and the like. The control index is derived by the simple prediction system mounted on each processing apparatus. The simple prediction system calculates each element value with, for example, monitoring data, a simulation database, and a convenience function, to derive a control index. The control system has features of being capable of establishing a learning system in which the control index is exchanged between the apparatuses and the optimal processing recipe is emulated.

The cloud simulation system and the simple prediction system can be achieved by the same simulation method as the simulation method performed by the controller 100. The detail thereof will be described later.

(Simulation Software)

Next, detail of the simulation method according to this embodiment will be described.

Figure 16:
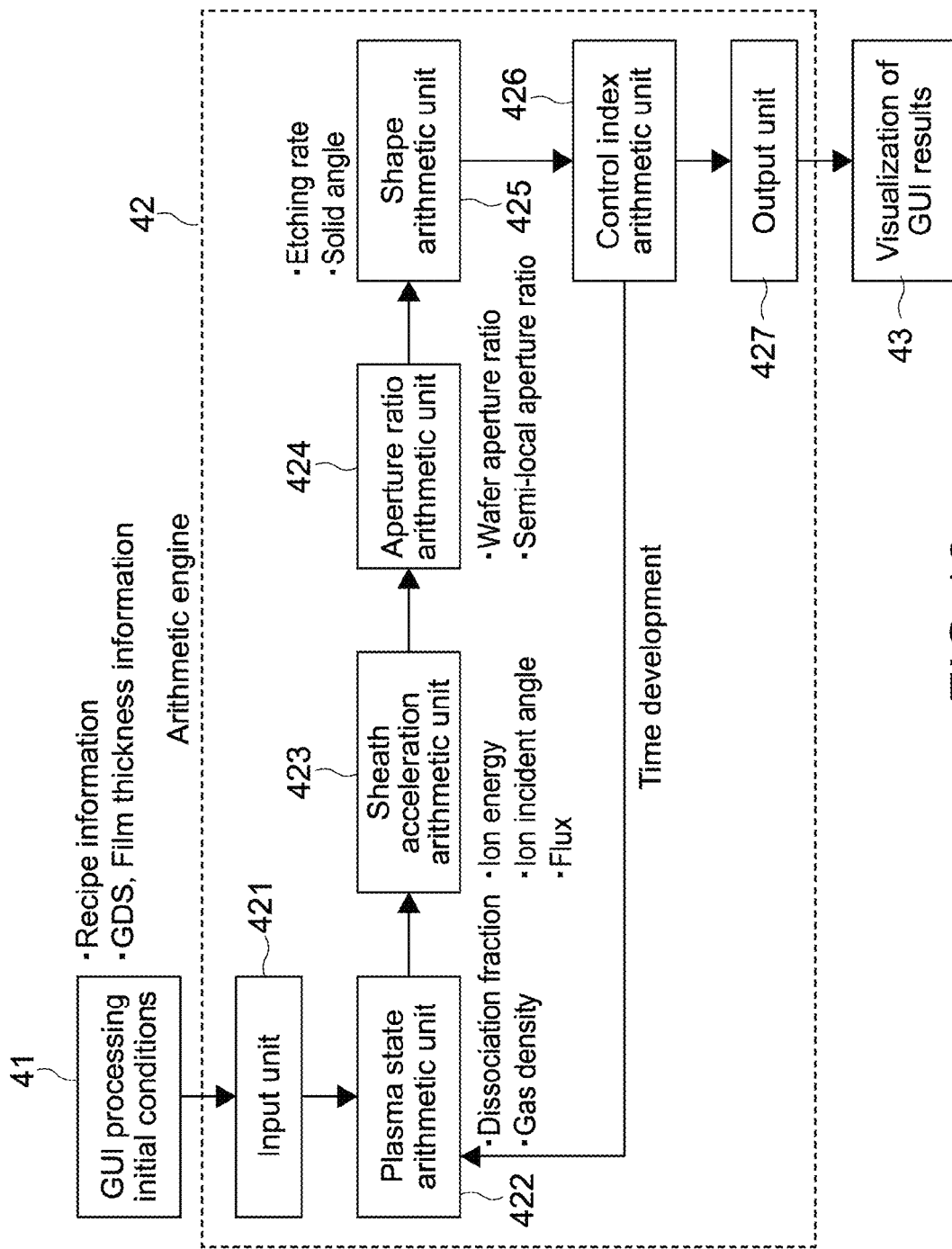
FIG. 16 is a functional block diagram for explaining the simulation software to which a simulation method according to this embodiment is applied.

FIG. 16 is a functional block diagram for explaining the simulation software (program) to which the simulation method according to this embodiment is applied;

The simulation software includes a graphical user interface (GUI) 41 for inputting an initial condition, an arithmetic engine 42, and a GUI 43 for visualizing the simulation results.

The arithmetic engine 42 includes an input unit 421, a plasma state arithmetic unit 422, a sheath acceleration arithmetic unit 423, an aperture ratio arithmetic unit 424, a shape arithmetic unit 425, a control index arithmetic unit 426, and an output unit 427. Here, the input unit 221 constitutes the input unit 11 of the controller 100. The plasma state arithmetic unit 422, the sheath acceleration arithmetic unit 423, the aperture ratio arithmetic unit 424, and the shape arithmetic unit 425 constitute the arithmetic unit 12 of the controller 100, and the control index arithmetic unit 426 corresponds to the control index arithmetic unit 13 of the controller 100. The output unit 427 constitutes the output unit 14 of the controller 100.

The execution platform of the simulation software may be any one of Windows (registered trademark), Linux (registered trademark), Unix (registered trademark), and Mac (registered trademark), for example. Moreover, the GUIs 21 and 23 may use any language such as OpenGL, Motif, and tcl/tk. The programming language of the arithmetic engine 22 may be any programming language such as C, $C^{++}$, Fortran, and JAVA (registered trademark).

From the GUI 41, recipe information, apparatus information, parameters for calculation, graphic design system (GDS) data (mask information), and film thickness information are input as the initial condition. The plasma state arithmetic unit 422 calculates the density and dissociation fraction (D) of each type of gas (ion and radical) in bulk plasma are calculated based on the initial condition. The sheath acceleration arithmetic unit 423 calculates the ion energy distribution function (IEDF) as the final state of being accelerated (including collision with radical) in the sheath of the ion generated in bulk plasma, the ion angular distribution function (IADF) on a pattern, and the incident flux of the ion and radical. For the calculation, the database obtained from the actual measurement or the like may be used.

The aperture ratio arithmetic unit 424 derives the wafer aperture ratio ($R_G$) and the semi-local aperture ratio ($R_S$) from the GDS data and the film thickness information, and calculates the influence (having a linear relationship with each other) on the flux. The incident flux of the ion and radical is used to calculate the shape development (etching rate (ER) and solid angle ($\Omega_L$) in the shape arithmetic unit 425. The shape development model may use any one of a characteristic curve method, a string method, a shock tracking method, a level set method, a ray-tracing model, and a cell removal method.

The control index arithmetic unit 426 calculates the control index using the obtained dissociation fraction (D), etching rate (ER), wafer aperture ratio ($R_G$), semi-local aperture ratio ($R_S$), and solid angle ($\Omega_L$). After that, the above-mentioned calculation is repeated with time development.

After the calculation, the output unit 427 outputs the results of the processing time dependence of the control index to a file. Moreover, the results can be visualized by the GUI 43. The data output and the visualization may be performed in real time during calculation.

(Execution Procedure of Simulation Method)

The simulation method according to this embodiment includes the following calculation process. The calculation process is stored in the arithmetic unit 12 of the controller 100 as a simulation program.

(a1) Processing conditions for performing etching process using plasma on the surface of a wafer covered by a mask having a predetermined mask thickness and aperture ratio are acquired.

(b1) Based on the processing conditions, the flux amount of a reaction product that enters the surface of the wafer is calculated.

(c1) Based on mask information including the mask thickness and aperture ratio and the flux amount, the etching rate of the wafer is calculated.

(d1) Based on the processing conditions and the etching rate, the dissociation fraction of the reaction product is calculated.

(e1) Based on the mask information and the etching rate, the solid angle at a predetermined evaluation point set on the surface of the wafer corresponding to the view area in which plasma space can be seen from the evaluation point is calculated.

(f1) Based on the etching rate, the dissociation fraction, the solid angle, and the aperture ratio, the control index for evaluating the shape of the surface of the wafer is calculated.

The calculation procedure in the simulation method will be described with reference to FIG. 9.

The simulation method (simulation program) according to this embodiment includes a step of calculating the flux amount ($\Gamma$) of a reaction product that enters a pattern (S201), a step of calculating the etching rate (ER) of the pattern (S202), a step of calculating the dissociation fraction (D) of the reaction product (S203), a step of acquiring the mask aperture ratio ($R_G$ and $R_S$) (S204), a step of calculating the solid angle ($\Omega_L$) at the evaluation point on the pattern (S205), and a step of calculating the control index ($(1-D)*ER*(R_G+R_S)\Omega_L$) (S206).

(a) Acquiring Processing Conditions

The processing conditions include mask information including the thickness and aperture shape of the mask RM, the thickness of the processed film, the process recipe (type and flow rate of gas, pressure, bias power, wafer temperature, etc.), and the like.

When the shape simulation is executed in the arithmetic unit 12, a recipe condition 31, a mask information 32, and a film thickness information 33 are acquired via the input unit 11 (FIG. 1). The recipe condition 31 corresponds to the processing conditions or etching conditions, and the mask information 32 includes the thickness, aperture shape, and size of the mask RM, for example. The film thickness information 33 includes information on the thickness of a workpiece (processed film).

The aperture ratio of the mask RM includes the wafer aperture ratio ($R_G$) and the semi-local aperture ratio ($R_S$). The wafer aperture ratio ($R_G$) and the semi-local aperture ratio ($R_S$) are calculated based on the mask information 32 by the aperture ratio arithmetic unit 424 (Step S204).

The wafer aperture ratio ($R_G$) is the ratio of the opening area of the mask RM to the area (covering area+opening area) of the mask RM. Specifically, the wafer aperture ratio ($R_G$) is the aperture ratio in the entire wafer W.

The semi-local aperture ratio ($R_S$) is the ratio of the opening area of the mask RM in a semi-local area that includes an evaluation point (local area) and is smaller than the wafer W to the area of the semi-local area.

In this embodiment, the semi-local aperture ratio ($R_S$) is set for each evaluation point. For example, the semi-local area is set in a circular shape with a plurality of evaluation points being center. However, the semi-local area may be set in a polygon such as a rectangle.

The semi-local area is set to be smaller than one device (chip), for example. The judgment standard of the size may be a diameter or area. For example, the diameter of the semi-local area is set to be smaller than the length of a side of a device (e.g., 20 to 30 mm). The upper limit of the radius of the semi-local area is favorably about 5 times larger than the average free path of plasma. The average free path is, for example, 1 to several mm although it varies depending on the process conditions.

(b) Calculation of Flux Amount

The flux amount ($\Gamma$) of a reaction product that enters an evaluation point is calculated by the sheath acceleration arithmetic unit 423. In this embodiment, the flux amount ($\Gamma$) is calculated by comparing the plasma vapor-phase simulation results in which the gas flux and the light emission intensity can be calculated based on the recipe condition 31 with the light emission intensity data of OES included in the monitoring apparatus 108 (Step S201). In this embodiment, the flux amount of a reaction product SiBr that functions as an etching protection film is mainly calculated. However, in addition thereto, the flux amount of the ion or bromine radical that contributes to etching or another elemental particle such as oxygen may be calculated.

The flux amount ($\Gamma$) is calculated based on the recipe condition 31 and the dissociation fraction (D) of a reaction product calculated in the previous step of calculation time period, in the second step and the subsequent steps of calculation time period. Accordingly, because the flux amount ($\Gamma$) can be calculated taking into account the dissociation fraction (D) that varies depending on the etching rate, and the accuracy of the calculation is increased.

(c) Calculation of Etching Rate

The etching rate (ER) is calculated by the shape arithmetic unit 425. The etching rate (ER) is typically calculated based on the mask information 32, the film thickness information 33, and the flux amount ($\Gamma$) calculated in Step S201 (Step S202).

(d) Calculation of Dissociation Fraction

The dissociation fraction (D) is calculated by the plasma state arithmetic unit 422. The dissociation fraction (D) is calculated based on the recipe condition 31 and the etching rate (ER) calculated in Step S202 (Step S203). In this embodiment, the dissociation fraction (D) of a reaction product SiBr that functions as an etching protection film due to plasma (more specifically, the ratio (1−D) in which SiBr is not dissociated by plasma) is calculated.

The dissociation fraction (D) is calculated by, for example, the following formula: $D=n_i/(n_i+n_R)$ (where $n_i$ and $n_R$ represent the gas density of the ion and radical in which a reaction product is involved, respectively). Specifically, the obtained gas density is used to calculate the light emission intensity (Ic) by the method described in Japanese Patent Application Laid-open No. 2011-134927, for example, and the value calculated based on the formula is calculated as the dissociation fraction (D) when the difference between the light emission intensity (Ic) and the measurement value of OES (Io) is not more than 10%.

In this embodiment, taking into account that the generation amount of a reaction product varies due to the variability in the etching rate (ER), the dissociation fraction (D) is updated for each time step and the flux amount ($\Gamma$) and the etching rate (ER) are calculated based on the results. Accordingly, as compared with the case where the measurement value obtained from the monitoring apparatus (OES) is emphasized to calculate the flux amount and the etching rate, it is possible to improve the simulation accuracy.

(e) Calculation of Solid Angle

The soli angle ($\Omega_L$) is calculated by the shape arithmetic unit 425. The soli angle ($\Omega_L$) is calculated based on the mask information 32 and the calculated etching rate (ER) (Step S205).

The soli angle ($\Omega_L$) is a three-dimensional viewing angle obtained by viewing a pattern opening from the processing surface. In other words, the solid angle ($\Omega_L$) is a solid angle at an evaluation point in which the upper side (plasma space) can be seen from the evaluation point without interruption by the mask RM or the pattern of the wafer W. Alternatively, the solid angle ($\Omega_L$) is a three-dimensional angle viewed from the evaluation point in which particles from plasma space can directly enter the evaluation point. The solid angle ($\Omega_L$) is calculated based on the coordinate of the evaluation point using an appropriate algorithm.

(f) Calculation of Control Index

The control index is calculated in the control index arithmetic unit 426. Specifically, the control index arithmetic unit 426 calculates the control index $((1-D)*ER*(R_G+R_S)\Omega_L)$ based on components of the dissociation fraction (D) quantitatively calculated in each step, the etching rate (ER), the solid angle MO, and the aperture ratio ($R_G$ and $R_S$) (Step S206). As shown in FIG. 10, the controller 100 corrects the recipe conditions in which a desired process conversion difference ($\Delta$CD) can be obtained based on the calculated control index. It should be noted that the recipe condition 31 may be updated to the corrected recipe conditions.

(g) Damage Evaluation

The simulation method or simulation program further includes a process (or step) of evaluating the damage on the wafer W due to the incident ion. As shown in FIG. 10, the controller 100 corrects the recipe conditions based on the calculated control index taking into account the damage ($d_R$) caused during processing of the wafer W.

As described above, according to this embodiment, because each component of the control index (the dissociation fraction (D), the etching rate (ER), the solid angle ($\Omega_L$), and the aperture ratio ($R_G$ and $R_S$)) is quantitatively calculated one by one unlike the reference technique where only the flux amount is used as an index of the process conversion difference, it is possible to perform universal etching control that does not depend on the processing apparatus. Accordingly, it is possible to make the varieties in properties between apparatuses negligible, and therefore, a semiconductor apparatus in which a plurality of processing apparatuses have the similar spec can be produced reliably.

In addition, because the process conversion difference ($\Delta$CD) and the damage (dR), which affect the properties, can be predicted and controlled and the variability in these apparatuses can be reduced, the device properties are expected to be improved. Moreover, because the frequency of maintenance of the apparatus decreases, the productivity is expected to be improved and the cost is expected to be reduced.

Furthermore, because flexible control that matches the demand of the device properties can be performed, it is possible to improve the degree of freedom of process/optical proximity correction (OPC)/layout designing. Moreover, it is possible to control the optimal conditions that satisfy the condition that prioritizes the process conversion difference, the condition that prioritizes the low damage, or both of the conditions in real time during processing.

(Second Embodiment)

Next, the second embodiment of the present disclosure will be described. It should be noted that the same components as those according to the first embodiment will be omitted appropriately.

(Centralized Process Control System)

Figure 17:
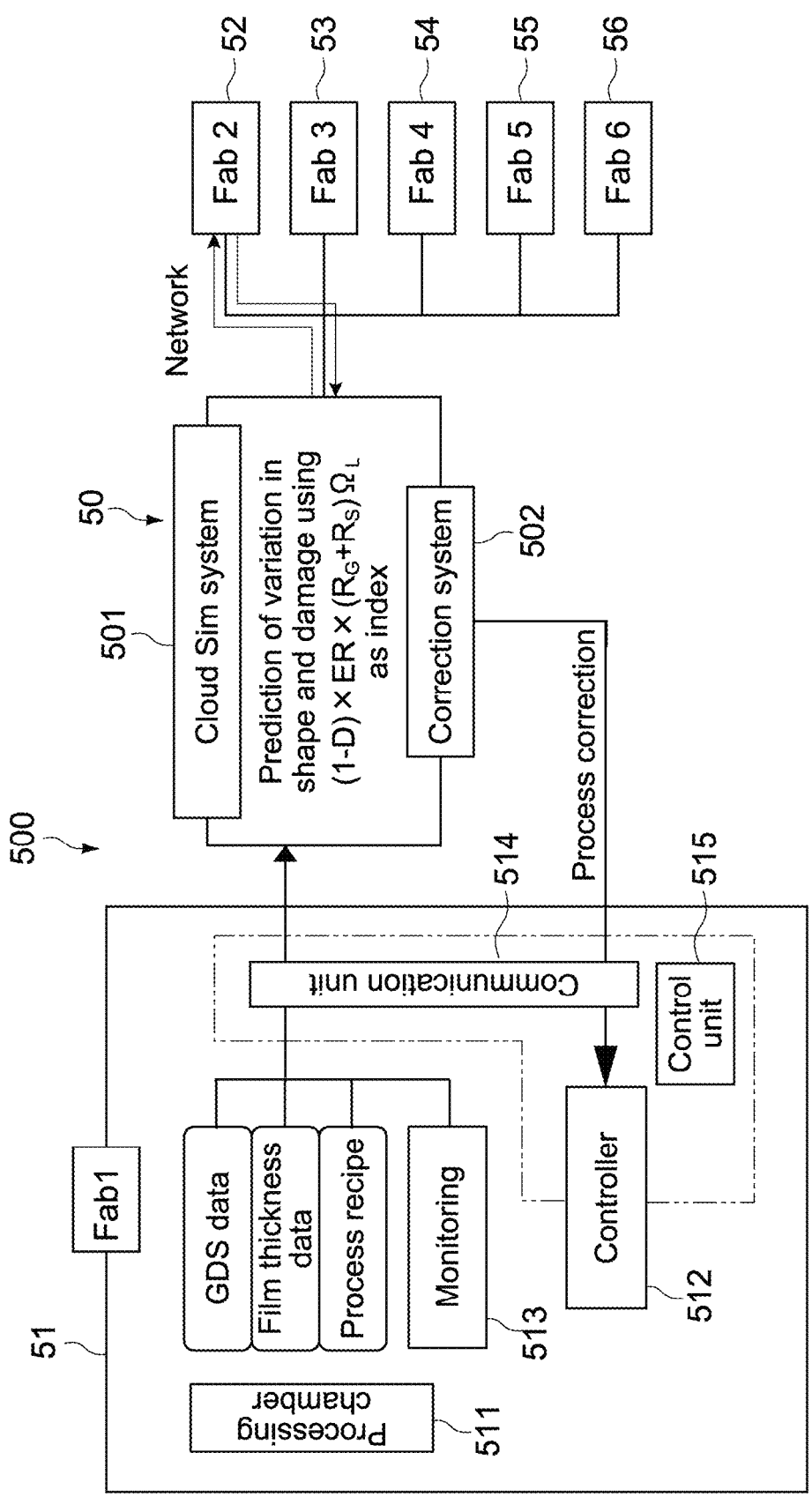
FIG. 17 is a schematic configuration diagram of a process control system according to a second embodiment of the present disclosure.

FIG. 17 is a block diagram showing a centralized process control system using cloud computing.

A process control system 500 according to this embodiment includes a plurality of etching apparatuses 51 to 56, and controllers 512 provided for the plurality of etching apparatuses 51 to 56 (only the controller provided for the processing apparatus 51 is shown in FIG. 17).

The etching apparatuses 51 to 56 are each configured of, but not limited to, a CCP etching apparatus, but may be configured of an ICP etching apparatus, an ECR etching apparatus, or the like. The etching apparatuses 51 to 56 are each connected to a server 50 through a wired or wireless network.

Each controller 512 includes a control unit 515 and a communication unit 514 that can communicate with the server 50.

The control unit 515 is configured to be capable of executing the following process.
(a2) The processing conditions for performing a predetermined processing process using plasma on the surface of a wafer covered by a mask having a predetermined mask thickness and aperture ratio and mask information including the mask thickness and the aperture ratio ($R_G$ and $R_S$) are transmitted.
(b2) The communication unit 514 is controlled to receive, form the server 50, the control index ($(1-D)*ER*(R_G+R_S)\Omega_L$) for evaluating the shape of the surface of the wafer generated using the flux amount ($\Gamma$) of a reaction product that enters the surface of the wafer calculated based on the processing conditions, the etching rate (ER) of the wafer calculated based on the mask information and the flux amount, the dissociation fraction (D) of the reaction product calculated based on the processing conditions and the etching rate, the solid angle ($\Omega_L$) at a predetermined evaluation point set on the surface of the wafer corresponding to the view area in which the plasma space can be seen from the evaluation point, which is calculated based on the mask information and the etching rate, and the aperture ratio.

The etching apparatus 51 includes a processing chamber 511 and a monitoring apparatus 513 that measures the plasma state of the processing chamber 511 in addition to the controller 512. The monitoring apparatus 513 is configured of at least one of OES, EES, QMS, IRLAS, an ion spectrum analyzer, and the like.

The controller 512 is configured to be capable of transmitting, to the server 50 via the communication unit 514, the processing conditions in the processing chamber 511 (e.g., GDS data, film thickness data, process recipe, reference index (desired spec of process conversion difference, damage, or the like)), the measurement value obtained from the monitoring apparatus 513, and the like.

The server 50 includes a simulator (cloud simulation system) 501 and a correction system 502.

The simulator 501 executes the simulation method described in the first embodiment. The simulator 501 is configured to be capable of calculating the control index ($(1-D)*ER*(R_G+R_S)\Omega_L$) for each etching apparatus using various parameters transmitted from the etching apparatuses 51 to 56 and transmitting the calculated control index to the etching apparatuses 51 to 56. The control index may be transmitted to the etching apparatuses 51 to 56 via the correction system 502.

The correction system 502 evaluates the variability in the control index calculated in the simulator 501 for each of the etching apparatuses 51 to 56. For example, in the case where the difference between the calculated control index and the reference index is not less than a predetermined value (e.g., 10% of the reference index), the correction system 502 is configured to transmit, to the corresponding etching apparatus, process correction information such that the control index is not more than the predetermined value.

The controller 512 corrects the process recipe based on the control index and the process correction information received from the server 50 via the communication unit 514, thereby maintaining the process conversion difference or damage of the wafer to be processed in the processing chamber 511 in a desired spec.

(Control Example)

Figure 18:
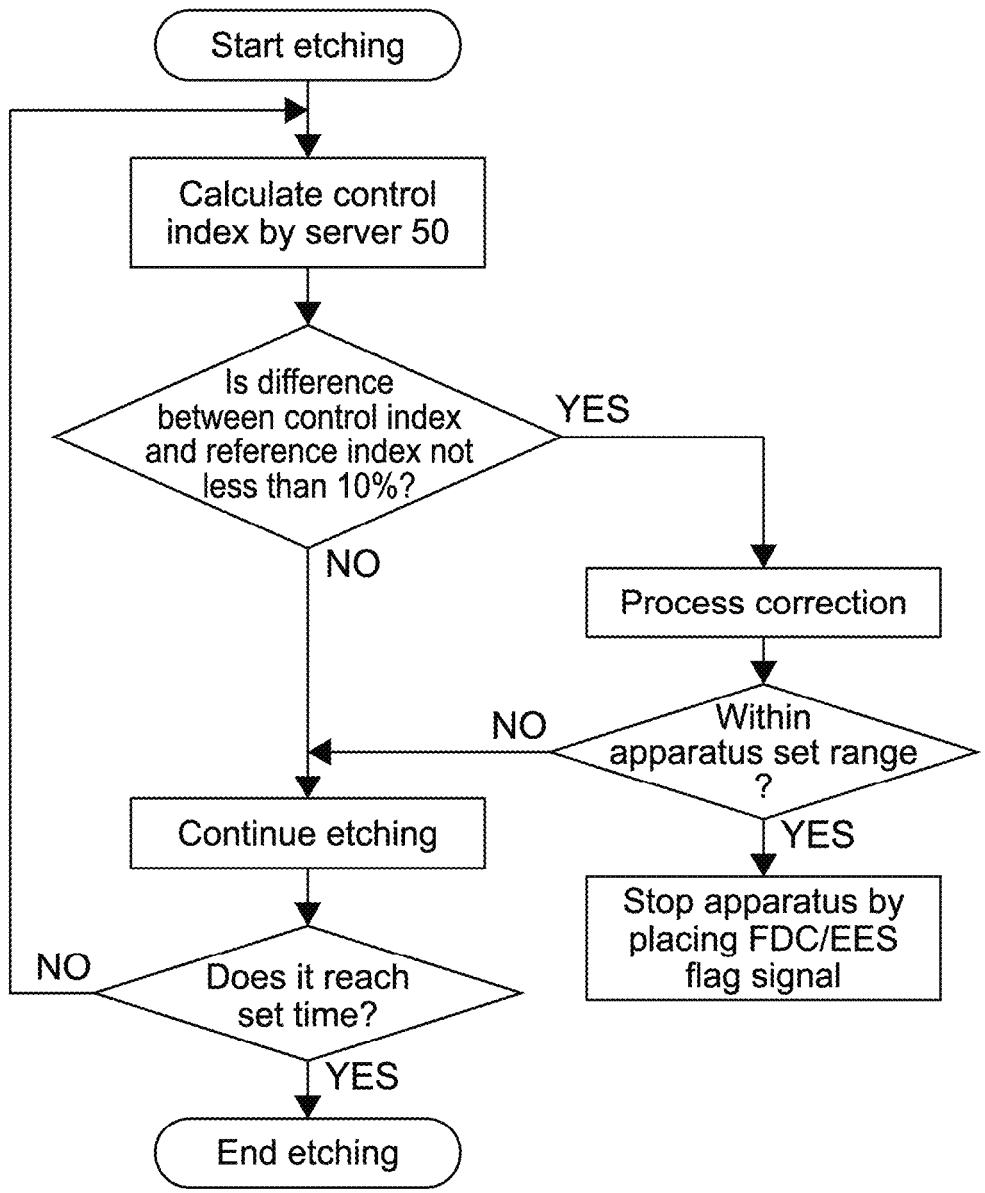
FIG. 18 is a flowchart showing the simulation executed in the process control system.

An example of processing control of the Si gate using the following process conditions will be described. The control procedure is shown in FIG. 18.

The initial film thickness of the Si gate includes 300 nm of a resist mask, 150 nm of a polysilicon film, and 2 nm of a silicon oxidized film ($SiO_2$), from the upper layer side.

(Process Conditions)

Bias frequency: upper electrode/lower electrode=60/13.56 MHz

Type and flow rate of gas: $HBr/O_2$=300/5 sccm

Pressure: 30 mTorr (3.99 Pa)

Wafer temperature: 60° C.

Vpp: 330 V

Processing time period: 120 seconds

Monitoring data of OES and EES of the etching apparatuses 51 to 56 is transmitted to the server 50 at the interval of 0.5 second during processing, and the control index ($(1-D)*ER*(R_G+R_S)\Omega_L$) corresponding to each etching apparatus in the simulator 501 is calculated.

At this time, by decreasing the attachment probability to the chamber wall from 1 so that the difference between OES light emission data of SiBr (wavelength of 290 nm) and the prediction light emission value of plasma vapor-phase simulation is not more than 10%, for example, the equilibrium state is obtained. Accordingly, the dissociation fraction (D) is obtained. Moreover, the flux ($\Gamma$) of the ion and radical that enter the pattern is obtained from the sheath simulation. On the other hand, the wafer aperture ratio ($R_G$=0.7) and the semi-local aperture ratio ($R_S$=0.6) of the mask are obtained from the GDS data. Then, the etching rate (ER) and the solid angle ($\Omega_L$) are obtained by the shape simulation in which the information, the process recipe, and the film thickness information are used as input values.

The simulator 501 determines the variability in the obtained control index, and gives process conditions (bias, gas flow rate, gas pressure, and wafer temperature) in the range of 50% in the case where the variation is, for example, not less than 10% of the reference index to correct it in margins of error of the reference index. The process correction information is transmitted from the correction system 502 to the etching apparatuses 51 to 56, and the process recipe is corrected by the controller 512 for each etching apparatus.

The above mentioned cycle is performed at the interval of 2 seconds during processing, and the process conversion difference and damage are suppressed in a spec. The control may be performed in the plane of the wafer, or any part of the wafer (e.g., central part (Center) and the peripheral portion (Edge)).

It should be noted that in the case where the correction area of process is out of the apparatus properties, e.g., the gas flow rate is larger than the upper limit of mass flow, an abnormal flag is placed by the fault detection and classification/equipment engineering system (FDC/EES) to stop the apparatus. In this case, the maintenance is manually performed in the chamber. Moreover, the simulation may be partially executed using a database or a function.

(Third Embodiment)

Next, a third embodiment of the present disclosure will be described. It should be noted that the same components as those according to the first embodiment will be omitted appropriately.

(Distributed Process Control System)

Figure 19:
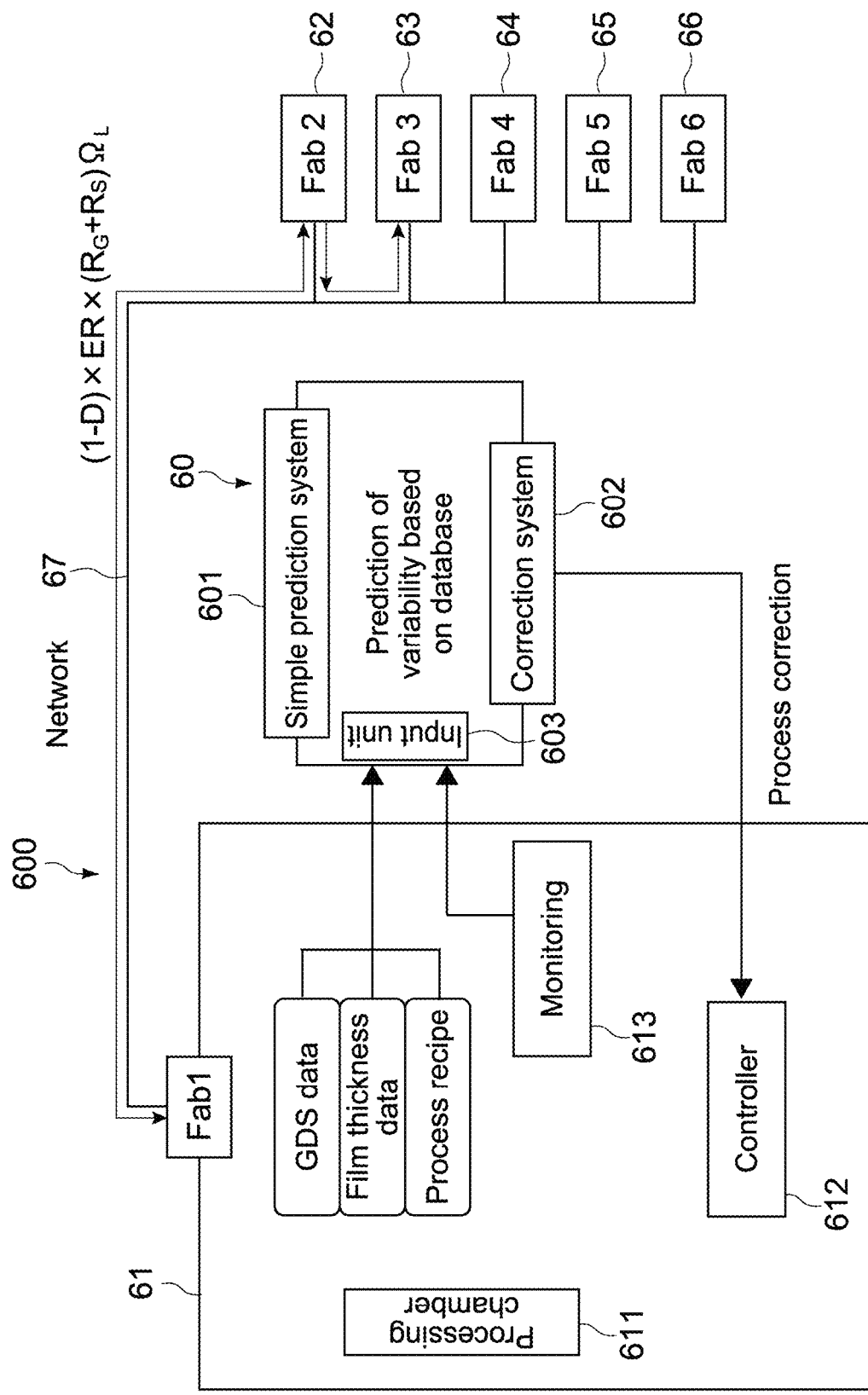
FIG. 19 is a schematic configuration diagram of a process control system according to a third embodiment of the present disclosure.

FIG. 19 is a block diagram showing a distributed process control system using mutual exchanges.

A process control system 600 according to this embodiment includes a first etching apparatus (processing apparatus) 61 that performs etching process using plasma on the surface of a wafer and an information processing apparatus 60 that predicts the shape development of the wafer due to the etching process.

The first etching apparatus 61 includes a processing chamber 611, a controller 612 that controls the processing chamber 611, and a monitoring apparatus 613 that measures the plasma state of the processing chamber 611. The first etching apparatus 61 is configured of, but not limited to, a first CCP etching apparatus, and may be configured of an ICP etching apparatus, an ECR etching apparatus, or the like.

The monitoring apparatus 613 is configured of any one of OES, EES, QMS, IRLAS, and an ion spectrum analyzer. The first etching apparatus 61 is configured to be capable of transmitting, to the information processing apparatus 60, the processing conditions (e.g., GDS data, film thickness data, process recipe, reference index (desired spec of process conversion difference, damage, or the like)) in the processing chamber 511, the measurement value obtained from the monitoring apparatus 513, and the like.

The information processing apparatus 60 includes an arithmetic unit (simple prediction system) 601 and a correction system 602, and an input unit 603.

The input unit 603 is configured to acquire, from the first etching apparatus 61, the processing conditions for performing the etching process on the surface of the wafer covered by the mask having a predetermined mask thickness and aperture ratio.

The arithmetic unit 601 is configured of a simulator that executes the simulation method described in the first embodiment.

The arithmetic unit 601 performs the following calculation process.

(a3) Based on the processing conditions, the flux amount ($\Gamma$) of the reaction product that enters the surface of the wafer is calculated.

(b3) Based on the mask information the mask thickness and aperture ratio ($R_G$ and $R_S$) and the flux amount, the etching rate (ER) of the wafer is calculated.

(c3) Based on the processing conditions and the etching rate, the dissociation fraction (D) of the reaction product is calculated.

(d3) Based on the mask information and the etching rate, the solid angle ($\Omega_L$) at a predetermined evaluation point set on the surface of the wafer corresponding to the view area in which plasma space can be seen from the evaluation point is calculated.

(e3) Based on the etching rate, the dissociation fraction, the solid angle, and the aperture ratio, the control index $((1-D)*ER*(R_G+R_S)\Omega_L)$ for evaluating the shape of the surface of the wafer is calculated.

The calculated control index is output to the first etching apparatus 61.

The arithmetic unit 601 is configured to calculate each element value by monitoring data of the first etching apparatus 61 acquired via the input unit 603, a simulation database, a convenience function, and the like, to derive the control index.

The correction system 602 evaluates the variability in the control index in the first etching apparatus 61, which is calculated in the arithmetic unit 601. For example, in the case where the difference between the calculated control index and the reference index is not less than a predetermined value (e.g., 10% of the reference index), the correction system 602 is configured to transmit, to the first etching apparatus 61, process correction information such that the control index is not more than the predetermined value.

The controller 612 corrects the process recipe based on the control index output from the information processing apparatus 60 and the process correction information, thereby maintaining the process conversion difference or damage of the wafer processed in the processing chamber 611 in a desired spec.

The process control system 600 further includes second to sixth etching apparatuses (processing apparatuses) 62 to 66. The etching apparatuses 62 to 66 each have the same configuration as the first etching apparatus 61. The etching apparatus 61 to 66 are configured to be communicably connected to the information processing apparatus 60 and another etching apparatus through a network (wired or wireless) 67, and to be capable of receiving the calculation results (control index) by the information processing apparatus 60 between the etching apparatuses 61 to 66.

In this embodiment, the second to sixth etching apparatuses 62 to 66 mutually exchange the control index of each etching apparatus calculated in the information processing apparatus 60 to correct it to the optimal recipe with low variability from the reference index. Because the component of the control index is a universal index that does not depend on apparatus, it can be mutually referred between the plurality of apparatuses.

(Control Example)

Figure 20:
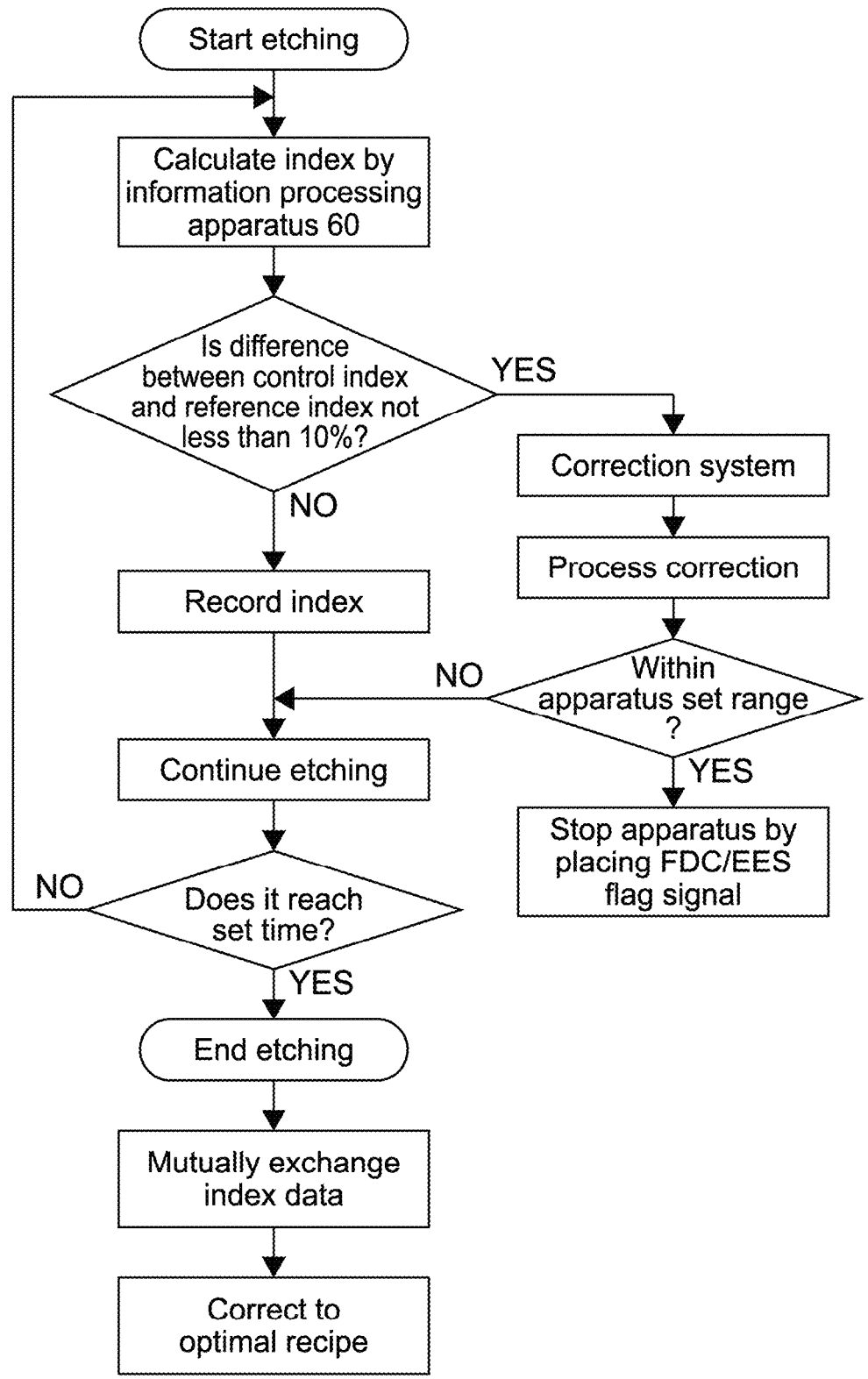
FIG. 20 is a flowchart showing the simulation executed in the process control system.

An example of process control of an $SiO_2$ film using the following process conditions will be described. The control procedure is described in FIG. 20.

(Process Conditions)

Bias frequency: upper electrode/lower electrode=60/13.56 MHz

Type and flow rate of gas: $C_4F_8/Ar/O_2$=11/400/8 sccm

Pressure: 30 mTorr (3.99 Pa)

Wafer temperature: 60° C.

Vpp: 1400 V

Processing time period: 200 seconds

Monitoring data of OES and EES of the etching apparatuses 61 to 66 is transmitted to the information processing apparatus 60 at the interval of 0.5 second during processing, and the control index $((1-D)*ER*(R_G+R_S)\Omega_L)$ corresponding to each etching apparatus is calculated in the arithmetic unit 601.

At this time, as the OES limit emission data (wavelength of 250 nm) of $CF_2$, the plasma state, and the function of EES, the dissociation fraction (D) and the flux amount ($\Gamma$) are obtained from a database (or function). Moreover, the wafer aperture ratio ($R_G$=0.2) and the semi-local aperture ratio ($R_S$=0.2) of the mask are obtained from the GDS data. Then, the etching rate (ER) and the solid angle ($\Omega_L$) are obtained using the information, the process recipe, and the film thickness information as input values.

The arithmetic unit 601 determines the variability in the obtained control index, and gives process conditions (bias, gas flow rate, gas pressure, and wafer temperature) in the range of 50% in the case where the variation is, for example, not less than 10% of the reference index to correct it in margins of error of the reference index. The process correction information is transmitted from the correction system 602 to the etching apparatuses 61 to 66, and the controller 612 corrects the process recipe for each apparatus.

The above mentioned cycle is performed at the interval of 2 seconds during processing, and the process conversion difference and damage are suppressed in a spec. The control may be performed in the plane of the wafer, or any part of the wafer (e.g., central part (Center) and the peripheral portion (Edge)).

The control index data is successively recorded for each of the etching apparatuses 61 to 66. The control index data is exchanged between the etching apparatuses 61 to 66 through the network 67 after (or before) the etching to correct it to the optimal recipe with low variability from the reference index.

It should be noted that in the case where the correction area of process is out of the apparatus properties, e.g., the gas flow rate is larger than the upper limit of mass flow, an abnormal flag is placed by the fault detection and classification/equipment engineering system (FDC/EES) to stop the apparatus. In this case, the maintenance is manually performed in the chamber.

(Fourth Embodiment)

Next, a fourth embodiment of the present disclosure will be described. It should be noted that the same components as those according to the first embodiment will be omitted appropriately.

(Process Design Method)

In this embodiment, a process design method using the simulation method described in the first embodiment will be described.

The process design method according to this embodiment is executed in the following procedure. It should be noted that the calculation process is executed by an information processing apparatus (computer) or a cloud server.

(a4) Processing conditions for performing etching process using plasma on the surface of a wafer covered by a mask having a predetermined mask thickness and aperture ratio are acquired.

(b4) Based on the processing conditions, the flux amount of the reaction product that enters the surface of the wafer is calculated.

(c4) Based on the mask information including the mask thickness and aperture ratio and the flux amount, the etching rate of the wafer is calculated.

(d4) Based on the processing conditions and the etching rate, the dissociation fraction of the reaction product is calculated.

(e4) Based on the mask information and the etching rate, the solid angle at a predetermined evaluation point set on the surface of the wafer corresponding to the view area in which plasma space can be seen from the evaluation point is calculated.

(f4) Based on the etching rate, the dissociation fraction, the solid angle, and the aperture ratio, the control index for evaluating the shape of the surface of the wafer is calculated.

(h) The processing conditions are changed so that the control index is within a predetermined range.

Because the processes (a4) to (f4) are the same as the processes (a1) to (f1) described in the first embodiment, description thereof is omitted here.

As described above, the process conversion difference ($\Delta CD$) and the damage ($d_R$) depend on the control index $((1-D)*ER*(R_G+R_S)\Omega_L)$, and the process conversion difference and the damage change as the control index changes. Therefore, if the variability in the control index is within a spec, it is possible to reliably produce a semiconductor device with low variability in the process conversion difference or damage.

Figure 21:
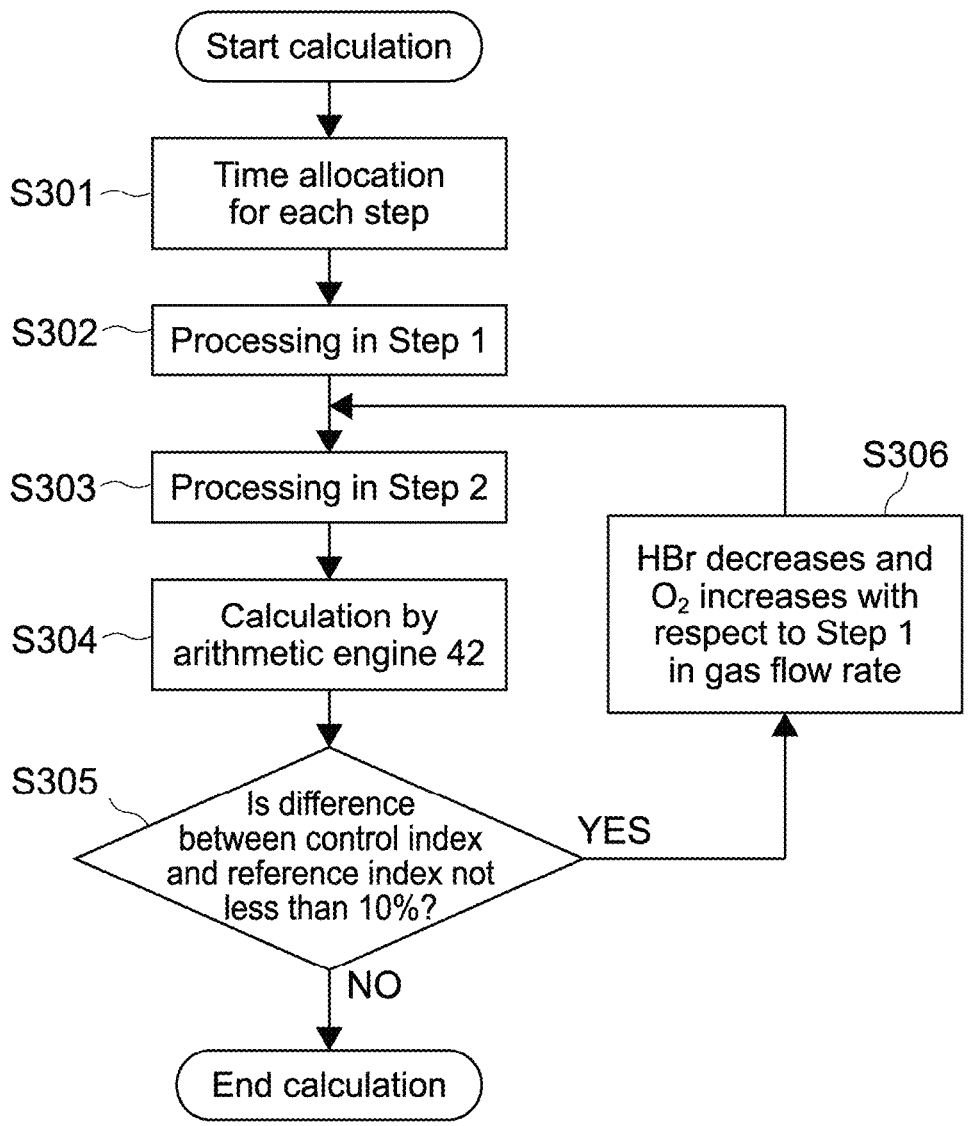
FIG. 21 is a flowchart showing a design method according to a fourth embodiment of the present disclosure.

In view of the above, in this embodiment, the processing conditions (process recipe and etching conditions) are changed so that the calculated control index $((1-D)*ER*(R_G+R_S)\Omega_L)$ is within a predetermined range (process (h)). With reference to FIG. 21, an example of the process design method will be described.

In this example, the design method that divides the process recipe into a plurality of steps so that the variability in the control index is within a spec in the Si gate processing whose fundamental conditions are the following process conditions is described. The initial film thickness of the Si gate includes 300 nm of a resist mask, 150 nm of a polysilicon film, and 2 nm of an $SiO_2$ film, from the upper layer side. The design flow is shown in FIG. 21.

(Process Conditions)

Bias frequency: upper electrode/lower electrode=60/13.56 MHz

Type and flow rate of gas: $HBr/O_2$=450/1 sccm

Pressure: 30 mTorr (3.99 Pa)

Wafer temperature: 60° C.

Vpp: 330 V

In this example, as the simplest example, a 2-step method is described. First, the time allocation is set for each step (Step S301). In this example, 80 seconds is set for the step 1 and 40 seconds is set for the step 2. Then, the etching process in the step 1 and the step 2 that use the abovementioned fundamental conditions as process conditions are sequentially executed (Step S302 and S303).

If the processing in the step 2 is continued, the depth of a pattern increases. If the solid angle gradually decreases, the amount of the reaction product (SiBr) that enters the side wall of the pattern decreases. As a result, the side etching of the pattern increases. Therefore, the process conversion difference gradually increases with time.

In view of the above, the simulation method described in the first embodiment is executed by the arithmetic engine 42 (FIG. 16), and the gas flow rate conditions in which the control index is within a predetermined range are calculated (Step S304 and S305). The predetermined range is, for example, that the difference from the reference index is less than 10% of the reference index. As a result, the gas flow rate of $HBr/O_2$ of 150/3 sccm is obtained. In the gas flow rate in the step 2, HBr decreases and $O_2$ increases as compared with the step 1 (Step S306). As described above, the generation of a protection film (SiBrxOy film) that is deposited on the processing surface of a pattern is facilitated, and the effect of the solid angle ($\Omega_L$) that decreases as the processing proceeds is made effectively uniform.

Then, by repeatedly performing the Steps S303 to S306 until the control index is within a predetermined range, the optimal gas flow rate conditions in which the side etching shape of the gate decreases, the process conversion difference is maintained, and the damage can be maintained to be uniform are determined.

The process conditions may be set for more steps (time period) depending on the control index spec. In addition, the process conditions to be changed are not limited to the gas flow rate, and may be bias voltage (Vpp), for example. In this case, although the solid angle decreases, it is possible to establish process design such that the damage is uniform. As an example of controlling the bias voltage, it decreases from 330 V being fundamental conditions 10 by 10 V. Because Ei corresponds to Vpp in the formula (4), it is possible to make process design taking into account the damage value.

(Fifth Embodiment)

Next, a fifth embodiment of the present disclosure will be described. It should be noted that the same components as those according to the first embodiment will be omitted appropriately.

(Mask Design Method)

In this embodiment, a mask design method using the simulation method described in the first embodiment is described.

The mask design method according to this embodiment is executed in the following procedure. It should be noted that the calculation process is executed by an information processing apparatus (computer) or a cloud server.

(a5) Processing conditions for performing etching process using plasma on the surface of a wafer covered by a mask having a predetermined mask thickness and aperture ratio are acquired.

(b5) Based on the processing conditions, the amount of the reaction product that enters the surface of the wafer is calculated.

(c5) Based on the mask information including the mask thickness and aperture ratio and the flux amount, the etching rate of the wafer is calculated.

(d5) Based on the processing conditions and the etching rate, the dissociation fraction of the reaction product is calculated.

(e5) Based on the mask information and the etching rate, the solid angle at a predetermined evaluation point set on the surface of the wafer corresponding to the view area in which plasma space can be seen from the evaluation point is calculated.

(f5) Based on the etching rate, the dissociation fraction, the solid angle, and the aperture ratio, the control index for evaluating the shape of the surface of the wafer is calculated.

(i) The design of the mask is changed so that the control index is within a predetermined range.

Because the processes (a5) to (f5) are the same as the steps (a1) to (f1) described in the first embodiment, description thereof is omitted here.

(Design Example 1)

For example, in the case where a normal resist mask having a taper angle of 90° is used to perform etching, the control index $((1-D)*ER*(R_G+R_S)\Omega_L)$ is varied because the solid angle $(\Omega_L)$ decreases as the etching proceeds.

Figure 22:
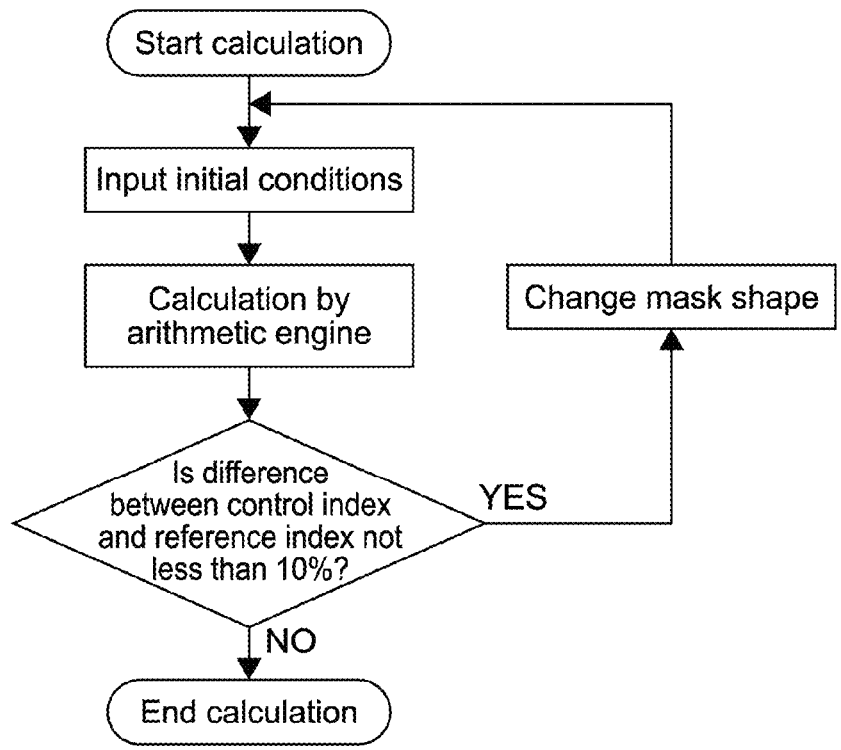
FIG. 22 is a flowchart showing an example of a design method according to a fifth method of the present disclosure.

In view of the above, in this embodiment, by changing the design of the mask being initial conditions (process (i)), the simulation shown by the steps (a5) to (f5) is performed so that the deviation of the control index from the reference value (reference index) is within a spec (e.g., 10%). The design example is shown in FIG. 22. In this example, the taper angle of the mask opening is changed. As a design example, the taper angle of the mask opening being initial conditions is gradually decreased from 90° 0.2 by 0.2°, for example. At the same time, the mask thickness may be changed. For example, the mask thickness is decreased from the initial conditions 20 by 20 nm.

(Design Example 2)

Figure 23:
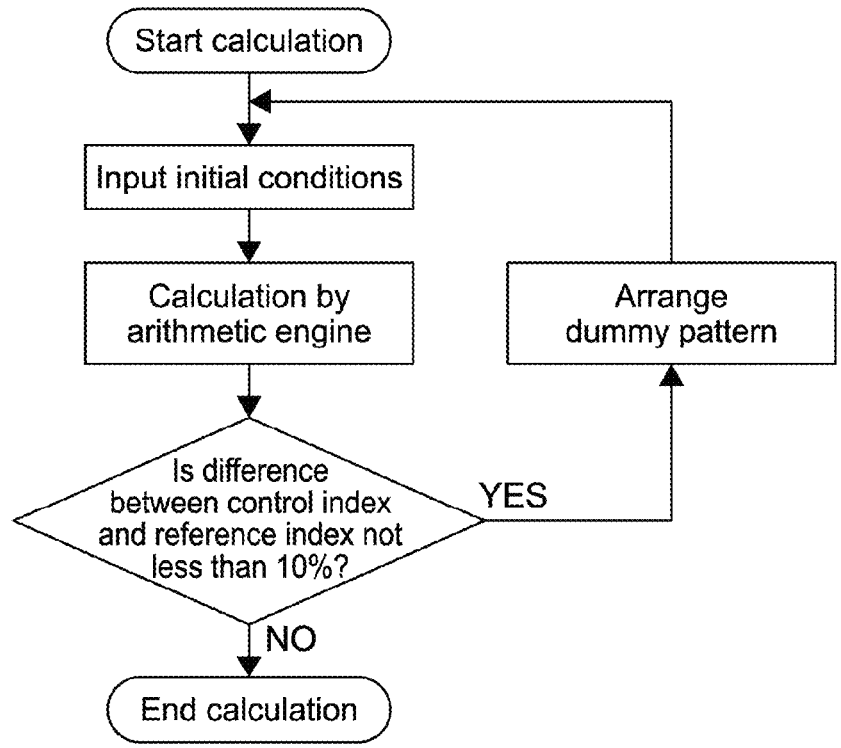
FIG. 23 is a flowchart showing another example of the design method according to the fifth embodiment of the present disclosure.

On the other hand, in the case where the verticalization of the shape (process conversion difference) is prioritized more than the reduction of the damage, the aperture ratio of the mask may be changed as a modified example of mask design. Also in this case, the simulation is executed so that the variability in the control index is within a spec (e.g., 10%). The design example is shown in FIG. 23. In this example, a dummy pattern (typically, resist pattern) is arranged in the vicinity of the target pattern, and the semi-local aperture ratio $(R_S)$ is changed. Specifically, the dummy pattern is arranged so that the semi-local aperture ratio is 5% smaller than the initial conditions.

Figure 24:
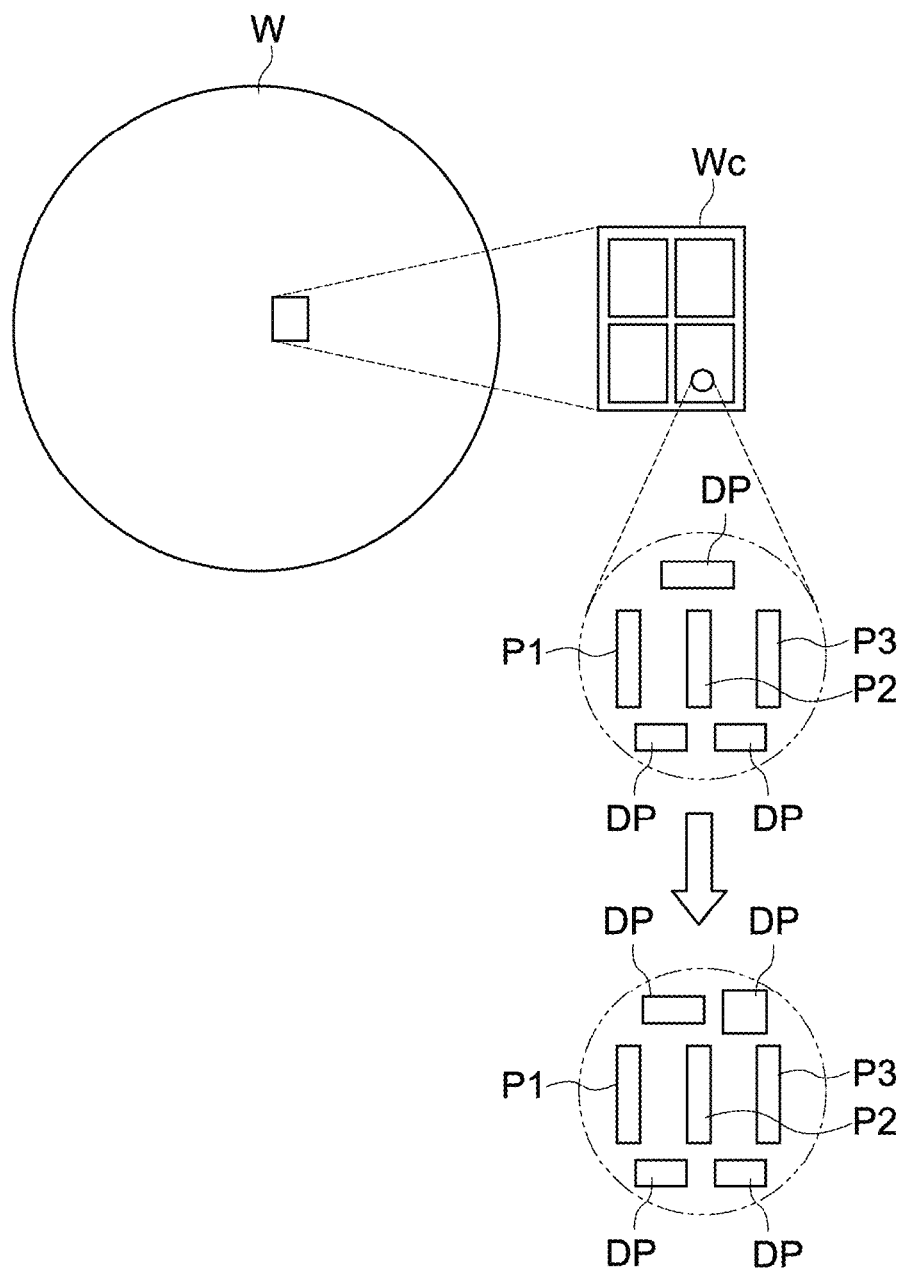
FIG. 24 is a schematic diagram showing an example of arranging a dummy pattern.

FIG. 24 is a schematic diagram showing an example of arranging the dummy pattern. The case where the shape development is predicted at the time when a pattern P2 out of a plurality of patterns P1 to P3 provided in an arbitrary chip Wc on the wafer W is used as a target, for example, is assumed. The shape, size, arrangement, and the like of the dummy pattern are changed so that the incident radical amount to the pattern P2 is optimal in the designing process.

By arranging a dummy pattern DP to reduce the semi-local aperture ratio, the amount of the reaction product that enters the pattern P2 from the resist mask increases. Accordingly, it is possible to reduce the process conversion difference. The dummy pattern is arranged so that the chip level aperture ratio is reduced by 5%, for example. The distance between the target pattern and the dummy pattern is not particularly limited, and is favorably set to be in several times more than the average free path of the reaction product although it varies depending on the pressure conditions of the process, or the like.

The design method according to this embodiment is not limited to the above-mentioned examples, and can be applied to the determination of the layout or shape of the target pattern or the layout of another pattern that is formed in the vicinity of the target pattern, for example.

Although embodiments of the present disclosure have been described, the present disclosure is not limited to the above-mentioned embodiments and various modifications can be made without departing from the gist of the present disclosure.

For example, in the above-mentioned embodiments, a silicon substrate has been described as a workpiece. However, the workpiece is not limited thereto, and may be another semiconductor substrate such as Ga—As. The present disclosure can be applied also to the workpiece including another material such as metal and plastic. Additionally, the processed film may be an insulating film other than the $SiO_2$ film, a conductive film, and another function film.

Moreover, although, in the second and third embodiments, a process control system including a plurality of etching apparatuses has been described, it goes without saying that a single etching apparatus can be used to achieve the same process control system.

Furthermore, in the second and third embodiments, the control method of the control index may be adjusted depending on the priority of the process conversion difference and damage. For example, in the case of the process conditions of the Si gate processing in the second embodiment, the process conditions are corrected with the shape priority until the remaining film of the polysilicon film is 10 nm, which is predicted by the shape simulation, and after that, the process conditions are corrected with the control index of the damage priority to reduce the damage of the Si substrate being a base. Accordingly, it is possible to improve the processing accuracy and to reduce the damage.

It should be noted that the present disclosure may also take the following configurations.

(1) A simulation method including:

acquiring processing conditions for performing an etching process using plasma on a surface of a wafer covered by a mask having a predetermined mask thickness and aperture ratio;

calculating, based on the processing conditions, a flux amount of a reaction product that enters the surface of the wafer;

calculating, based on mask information including the mask thickness and the aperture ratio and the flux amount, an etching rate of the wafer;

calculating, based on the processing conditions and the etching rate, a dissociation fraction of the reaction product;

calculating, based on the mask information and the etching rate, a solid angle at a predetermined evaluation point set on the surface of the wafer, the solid angle corresponding to a view area in which plasma space can be seen from the evaluation point; and calculating, based on the etching rate, the dissociation fraction, the solid angle, and the aperture ratio, a control index for evaluating a shape of the surface of the wafer.

(2) The simulation method according to (1) above, in which the calculating the flux amount of the reaction product includes calculating the flux amount of the reaction product based on the processing conditions and the calculated dissociation fraction of the reaction product.

(3) The simulation method according to (1) or (2) above, in which
the calculating the flux amount of the reaction product includes calculating the flux amount of the reaction product that functions as an etching protection film.

(4) The simulation method according to (3) above, further including
evaluating, based on the control index, damage on the wafer, which is caused due to an incident ion.

(5) The simulation method according to any one of (1) to (4), in which
as the aperture ratio, a wafer aperture ratio and a semi-local aperture ratio are used, the wafer aperture ratio being a ratio of the opening area of the mask to the area of the mask, the semi-local aperture ratio being a ratio of the opening area of the mask in a semi-local area that includes the evaluation point and is smaller than the wafer to the area of the semi-local area.

(6) The simulation method according to (5), in which
the control index is represented by the following formula:
$(1-D)*ER*(R_G+R_S)\Omega_L$ (where ER represents the etching rate, D represents the dissociation fraction, $\Omega_L$ represents the solid angle, $R_G$ represents the wafer aperture ratio, and $R_S$ represents the semi-local aperture ratio).

It should be understood by those skilled in the art that various modifications, combinations, sub-combinations and alterations may occur depending on design requirements and other factors insofar as they are within the scope of the appended claims or the equivalents thereof.

What is claimed is:

1. A simulation method comprising:

acquiring processing conditions for performing an etching process using plasma on a surface of a wafer covered by a mask having a predetermined mask thickness and aperture ratio;

calculating, based on the processing conditions, a flux amount of a reaction product that enters the surface of the wafer;

calculating, based on mask information including the mask thickness and the aperture ratio and the flux amount, an etching rate of the wafer;

calculating, based on the processing conditions and the etching rate, a dissociation fraction of the reaction product;

calculating, based on the mask information and the etching rate, a solid angle at a predetermined evaluation point set on the surface of the wafer, the solid angle corresponding to a view area in which plasma space can be seen from the evaluation point;

calculating, based on the etching rate, the dissociation fraction, the solid angle, and the aperture ratio, a control index for evaluating a shape of the surface of the wafer, and modifying the etching process based on the calculations.

2. The simulation method according to claim 1, wherein the calculating the flux amount of the reaction product includes calculating the flux amount of the reaction product based on the processing conditions and the calculated dissociation fraction of the reaction product.

3. The simulation method according to claim 1, wherein the calculating the flux amount of the reaction product includes calculating the flux amount of the reaction product that functions as an etching protection film.

4. The simulation method according to claim 3, further comprising
evaluating, based on the control index, damage on the wafer, which is caused due to an incident ion.

5. The simulation method according to claim 1, wherein as the aperture ratio, a wafer aperture ratio and a semi-local aperture ratio are used, the wafer aperture ratio being a ratio of the opening area of the mask to the area of the mask, the semi-local aperture ratio being a ratio of the opening area of the mask in a semi-local area that includes the evaluation point and is smaller than the wafer to the area of the semi-local area.

6. The simulation method according to claim 5, wherein the control index is represented by the following formula:
$(1-D)*ER*(R_G+R_S)\Omega_L$ (where ER represents the etching rate, D represents the dissociation fraction, $\Omega_L$ represents the solid angle, $R_G$ represents the wafer aperture ratio, and $R_S$ represents the semi-local aperture ratio).

7. The simulation method according to claim 1, wherein the modifying the etching process includes modifying a gas pressure, a gas flow rate, a bias, a wafer temperature, or combinations thereof.

8. The simulation method according to claim 1, wherein the calculating the dissociation fraction is based on a gas density of an ion and a gas density of a radical involved in the reaction product.

9. A non-transitory computer-readable medium storing thereon a simulation program that, when executed by a processor of an information processing apparatus, causes the information processing apparatus to perform operations comprising:

calculating, based on processing conditions for performing an etching process using plasma on a surface of a wafer covered by a mask having a predetermined mask thickness and aperture ratio, a flux amount of a reaction product that enters the surface of the wafer;

calculating, based on mask information including the mask thickness and the aperture ratio and the flux amount, an etching rate of the wafer;

calculating, based on the processing conditions and the etching rate, a dissociation fraction of the reaction product;

calculating, based on the mask information and the etching rate, a solid angle at a predetermined evaluation point set on the surface of the wafer, the solid angle corresponding to a view area in which plasma space can be seen from the evaluation point;

calculating, based on the etching rate, the dissociation fraction, the solid angle, and the aperture ratio, a control index for evaluating a shape of the surface of the wafer; and modifying the etching process based on the calculations.

10. A process control system, comprising:

a plurality of etching apparatuses; and controllers provided to the plurality of etching apparatuses, each of the plurality of controllers including a communication unit and a controller, the communication unit configured to communicate with a server, the controller configured to transmit processing conditions for performing an etching process using plasma on a surface of a wafer covered by a mask having a predetermined mask thickness and aperture ratio and mask information including the mask thickness and the aperture ratio, control the communication unit to receive, from the server, a control index for evaluating a shape of the surface of the wafer, the control index generated using a flux amount of a reaction product that enters the surface of the wafer, which is calculated based on the processing conditions, an etching rate of the wafer, which is calculated based on the mask information and the flux amount, a dissociation fraction of the reaction product, which is calculated based on the processing conditions and the etching rate, a solid angle at a predetermined evaluation point set on the surface of the wafer, the solid angle corresponding to a view area in which plasma space can be seen from the evaluation point, the solid angle being calculated based on the mask information and the etching rate, and the aperture ratio, and control the plurality of etching apparatuses to modify the etching process based on the calculations.

11. A process control system, comprising:

a first processing apparatus configured to perform an etching process using plasma on a surface of a wafer; and an information processing apparatus configured to predict shape development of the wafer, which is caused due to the etching process, the information processing apparatus including an input unit configured to acquire processing conditions for performing the etching process using plasma on a surface of a wafer covered by a mask having a predetermined mask thickness and aperture ratio, and an arithmetic unit configured to calculate, based on the processing conditions, a flux amount of a reaction product that enters the surface of the wafer, to calculate, based on mask information including the mask thickness and the aperture ratio and the flux amount, an etching rate of the wafer, to calculate, based on the processing conditions and the etching rate, a dissociation fraction of the reaction product, to calculate, based on the mask information and the etching rate, a solid angle at a predetermined evaluation point set on the surface of the wafer, the solid angle corresponding to a view area in which plasma space can be seen from the evaluation point, to calculate, based on the etching rate, the dissociation fraction, the solid angle, and the aperture ratio, a control index for evaluating a shape of the surface of the wafer, and to modify the etching process based on the calculations.

12. The process control system according to claim 11, further comprising a second processing apparatus that is configured to mutually communicate with the first processing apparatus and to receive arithmetic results obtained from the information processing apparatus.

13. A simulator comprising:

an input unit configured to acquire processing conditions for performing an etching process using plasma on a surface of a wafer covered by a mask having a predetermined mask thickness and aperture ratio, and an arithmetic unit configured to calculate, based on the processing conditions, a flux amount of a reaction product that enters the surface of the wafer, to calculate, based on mask information including the mask thickness and the aperture ratio and the flux amount, an etching rate of the wafer, to calculate, based on the processing conditions and the etching rate, a dissociation fraction of the reaction product, to calculate, based on the mask information and the etching rate, a solid angle at a predetermined evaluation point set on the surface of the wafer, the solid angle corresponding to a view area in which plasma space can be seen from the evaluation point, to calculate, based on the etching rate, the dissociation fraction, the solid angle, and the aperture ratio, a control index for evaluating a shape of the surface of the wafer, and to modify the etching process based on the calculations.

14. A process design method, comprising:

acquiring processing conditions for performing an etching process using plasma on a surface of a wafer covered by a mask having a predetermined mask thickness and aperture ratio;

calculating, based on the processing conditions, a flux amount of a reaction product that enters the surface of the wafer;

calculating, based on mask information including the mask thickness and the aperture ratio and the flux amount, an etching rate of the wafer;

calculating, based on the processing conditions and the etching rate, a dissociation fraction of the reaction product;

calculating, based on the mask information and the etching rate, a solid angle a predetermined evaluation point set on the surface of the wafer, the solid angle corresponding to a view area in which plasma space can be seen from the evaluation point;

calculating, based on the etching rate, the dissociation fraction, the solid angle, and the aperture ratio, a control index for evaluating a shape of the surface of the wafer; and changing the processing conditions so that the control index is within a predetermined range based on the calculations, thereby modifying the etching process.

15. A mask design method, comprising:

acquiring processing conditions for performing an etching process using plasma on a surface of a wafer covered by a mask having a predetermined mask thickness and aperture ratio;

calculating, based on the processing conditions, a flux amount of a reaction product that enters the surface of the wafer;

calculating, based on mask information including the mask thickness and the aperture ratio and the flux amount, an etching rate of the wafer;

calculating, based on the processing conditions and the etching rate, a dissociation fraction of the reaction product;

calculating, based on the mask information and the etching rate, a solid angle at a predetermined evaluation point set on the surface of the wafer, the solid angle corresponding to a view area in which plasma space can be seen from the evaluation point;

calculating, based on the etching rate, the dissociation fraction, the solid angle, and the aperture ratio, a control index for evaluating a shape of the surface of the wafer; and changing design of the mask so that the control index is within a predetermined range, based on the calculations.

16. The mask design method according to claim 15, wherein
the changing the design of the mask includes changing a taper angle of a mask opening.

17. The mask design method according to claim 15, wherein
the changing the design of the mask includes changing the aperture ratio.

* * * * *